United States Patent
Lieber et al.

(10) Patent No.: US 8,586,131 B2
(45) Date of Patent: Nov. 19, 2013

(54) LIQUID FILMS CONTAINING NANOSTRUCTURED MATERIALS

(75) Inventors: Charles M. Lieber, Lexington, MA (US); Guihua Yu, Cambridge, MA (US); Anyuan Cao, Honolulu, HI (US)

(73) Assignees: President and Fellows of Harvard College, Cambridge, MA (US); University of Hawaii, Honolulu, HI (US)

( * ) Notice: Subject to any disclaimer, the term of this patent is extended or adjusted under 35 U.S.C. 154(b) by 938 days.

(21) Appl. No.: 12/311,667

(22) PCT Filed: Oct. 10, 2007

(86) PCT No.: PCT/US2007/021602
§ 371 (c)(1),
(2), (4) Date: Dec. 16, 2009

(87) PCT Pub. No.: WO2008/130375
PCT Pub. Date: Oct. 30, 2008

(65) Prior Publication Data
US 2010/0143582 A1 Jun. 10, 2010

Related U.S. Application Data

(60) Provisional application No. 60/850,701, filed on Oct. 10, 2006.

(51) Int. Cl.
B05D 5/12 (2006.01)

(52) U.S. Cl.
USPC .......................................................... 427/96.1

(58) Field of Classification Search
USPC ..................................................... 427/98.4
See application file for complete search history.

(56) References Cited

U.S. PATENT DOCUMENTS

| | | | | |
|---|---|---|---|---|
| 6,730,739 | B2 * | 5/2004 | Gipson | 525/191 |
| 8,030,376 | B2 * | 10/2011 | Kurz | 523/333 |
| 2002/0080217 | A1 * | 6/2002 | Olsen | 347/93 |
| 2003/0111333 | A1 * | 6/2003 | Montgomery et al. | 204/164 |

(Continued)

OTHER PUBLICATIONS

Benattar et al. (adhesion of a free standing newton black film onto a solid substrate) May 23, 2006.*

(Continued)

*Primary Examiner* — Michael Cleveland
*Assistant Examiner* — Austin Murata
(74) *Attorney, Agent, or Firm* — Wolf, Greenfield & Sacks, P.C.

(57) ABSTRACT

The present invention generally relates to liquid films containing nanostructured materials, and, optionally, the use of this arrangement to organize nanostructures and to transfer the nanostructures to a surface. Liquid films containing nanostructures, such as nanoscale wires, can be formed in a gas such as air. By choosing an appropriate liquid, a liquid film can be expanded, for example to form a "bubble" having a diameter of at least about 5 cm or 10 cm. The size of the bubble can be controlled, in some cases, by controlling the viscosity of the liquid film. In some embodiments, the viscosity can be controlled to be between about 15 Pa s and about 25 Pa s, or controlled using a mixture of an aqueous liquid and an epoxy. In some cases, the film of liquid may be contacted with a surface, which can be used to transfer at least some of the nanostructures to the surface. In some cases, the nanostructures may be transferred as an orderly or aligned array. Once on the surface, the nanostructures may be reacted, etched, layered, etc., e.g., for use in an electric circuit.

35 Claims, 31 Drawing Sheets

(56) References Cited

U.S. PATENT DOCUMENTS

| | | | |
|---|---|---|---|
| 2005/0285116 A1* | 12/2005 | Wang | 257/76 |
| 2006/0186502 A1* | 8/2006 | Shimotani et al. | 257/458 |
| 2007/0111628 A1* | 5/2007 | Yagi et al. | 445/24 |
| 2007/0269924 A1* | 11/2007 | Gomez et al. | 438/99 |
| 2010/0127241 A1* | 5/2010 | Gruner et al. | 257/20 |

OTHER PUBLICATIONS

Benattar et al. "Adhesion of a Free-Standing Newton Black Film onto a Solid Substrate" May 2006.*

Andreatta, G., et al., "Deposition of organized surfactant films on solid substrates," *Colloids and Surfaces*, vol. 321, No. 1-3, pp. 211-217 (2008).

Benattar, J., et al., "Adhesion of a free-standing newton black film onto a solid substrate," *Angewandte Chem.*, vol. 45, pp. 4186-4188 (2006).

International Search Report and Written Opinion in PCT/US2007/021602 dated Jan. 29, 2009.

International Report on Patentability in PCT/US2007/021602 dated Apr. 15, 2009.

* cited by examiner

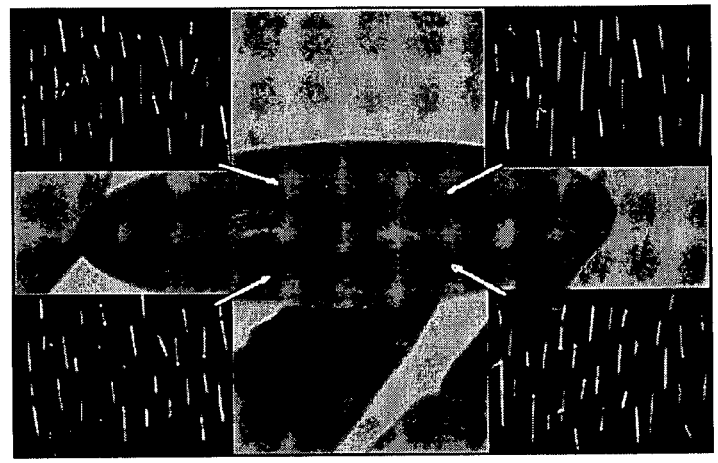
Fig. 2A
 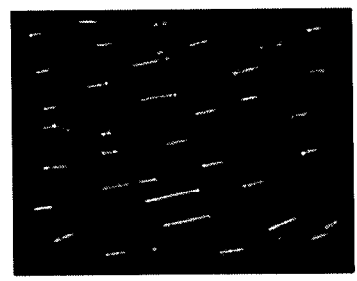
Fig. 2B    Fig. 2C
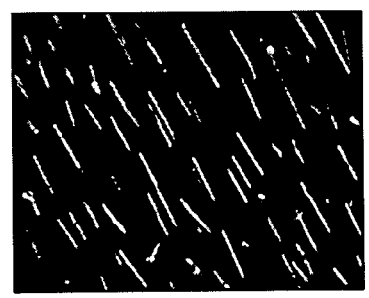
Fig. 2D

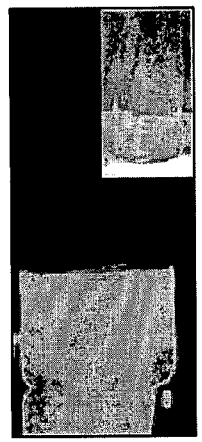 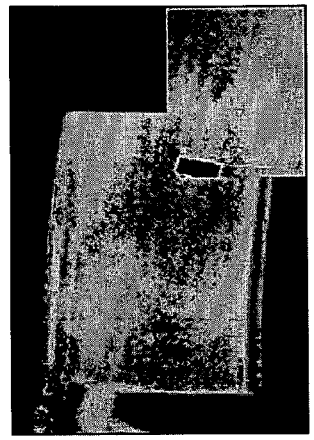
Fig. 7A          Fig. 7B
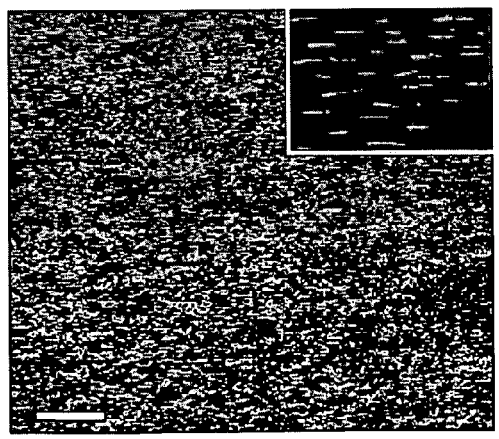
Fig. 7C $I_{on} \sim 4\ \mu A,\ g_m \sim 900\ nS,\ V_t \sim 1.5\ V$

LIQUID FILMS CONTAINING NANOSTRUCTURED MATERIALS

RELATED APPLICATIONS

This application is a National Stage application of PCT/US2007/021602, filed Oct. 10,2007, entitled "Liquid Films Containing Nanostructured Materials" by Liber, et al., which claims the benefit of U.S. Provisional Patent Application Ser. No. 60/850,701, filed Oct. 10, 2006, entitled "Liquid Films Containing Nanostructured Materials," by Lieber, et al., both incorporated herein by reference.

GOVERNMENT FUNDING

This invention was made with government support under FA9550-05-1-0279 and FA8650-06-C-7622 awarded by the U.S. Air Force. The government has certain rights in the invention.

FIELD OF INVENTION

The present invention generally relates to nanotechnology and, in particular, to liquid films containing nanostructured materials, for example nanowires, nanotubes, nanoparticles, or the like.

BACKGROUND

Interest in nanotechnology, in particular sub-microelectronic technologies such as semiconductor quantum dots and nanowires, has been motivated by the challenges of chemistry and physics at the nanoscale, and by the prospect of utilizing these structures in electronic and related devices. However, it has been difficult to manipulate large numbers of nanostructured materials, e.g., for mass production. Thus there is a need in the art for new and improved methods and techniques involving nanostructures.

SUMMARY OF THE INVENTION

The present invention generally relates to liquid films containing nanostructured materials, for example nanowires, nanotubes, nanoparticles, or the like. The subject matter of the present invention involves, in some cases, interrelated products, alternative solutions to a particular problem, and/or a plurality of different uses of one or more systems and/or articles.

The invention is directed to a method in one aspect. In one set of embodiments, the method includes acts of providing a film of liquid, suspended in a gas, containing nanoscale wires, and aligning a portion of the nanoscale wires on a surface by contacting at least a portion of the film of liquid to the surface. The method, in another set of embodiments, includes acts of providing a film of a first liquid, suspended in a second fluid, the first liquid containing nanostructures; allowing the nanostructures to organize with respect to each other in the film to form a pattern of the nanostructures in the film; and forming a portion of the nanostructures on a surface in a pattern corresponding to the pattern of the nanostructures in the film, by contacting at least a portion of the film of the first liquid to the surface.

In one set of embodiments, the method is a method for forming an electric circuit. According to one embodiment, the method includes acts of providing a film of liquid, suspended in a gas, containing nanostructures; contacting the film of liquid to a surface to transfer at least some of the nanostructures to the surface; and forming an electric circuit comprising at least some of the nanostructures on the surface.

In yet another set of embodiments, the method includes an act of rolling a film of liquid containing nanostructures around an axis. The method, in still another set of embodiments, includes an act of folding a film of liquid containing nanostructures around an axis. In yet another set of embodiments, the method includes an act of superpositioning a second portion of a film of liquid containing nanostructures onto a first portion of the film of liquid. The method, in another set of embodiments, includes an act of superpositioning at least a portion of a first film of liquid onto at least a portion of a second film of liquid. In some cases, the first film of liquid contains nanostructures.

Another aspect of the invention is directed to an article. In one set of embodiments, the article comprises a nanostructure, such as a nanoscale wire, and an epoxy. In another set of embodiments, the article comprises a film of liquid, suspended in a gas, containing a nanostructure such as a nanoscale wire. In some cases, the film of liquid has a viscosity between about 15 Pa s and about 25 Pa s, as measured using a rotational rheometer. In yet another set of embodiments, the article comprises a film of liquid, suspended in a gas, containing a nanostructure such as a nanoscale wire. In some cases, the film of liquid having physical characteristics such that it is able to be blown, under ambient conditions, to produce a bubble having a diameter of at least about 10 cm or 20 cm. In one set of embodiments, the article comprises a bubble of liquid, having a diameter of at least about 10 cm, containing a nanostructure such as a nanoscale wire. In another set of embodiments, the article comprises a bubble of liquid, suspended from a wire, containing a nanostructure such as a nanoscale wire.

In another aspect, the present invention is directed to a method of making one or more of the embodiments described herein, for example, a liquid film containing a nanostructured material. In another aspect, the present invention is directed to a method of using one or more of the embodiments described herein, for example, a liquid film containing a nanostructured material.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures:

FIGS. 2A-2F illustrate the alignment of nanowires, in another embodiment of the invention;

FIGS. 7A-7C illustrate the alignment of nanowires, in yet another embodiment of the invention;

DETAILED DESCRIPTION

Figure 1A:
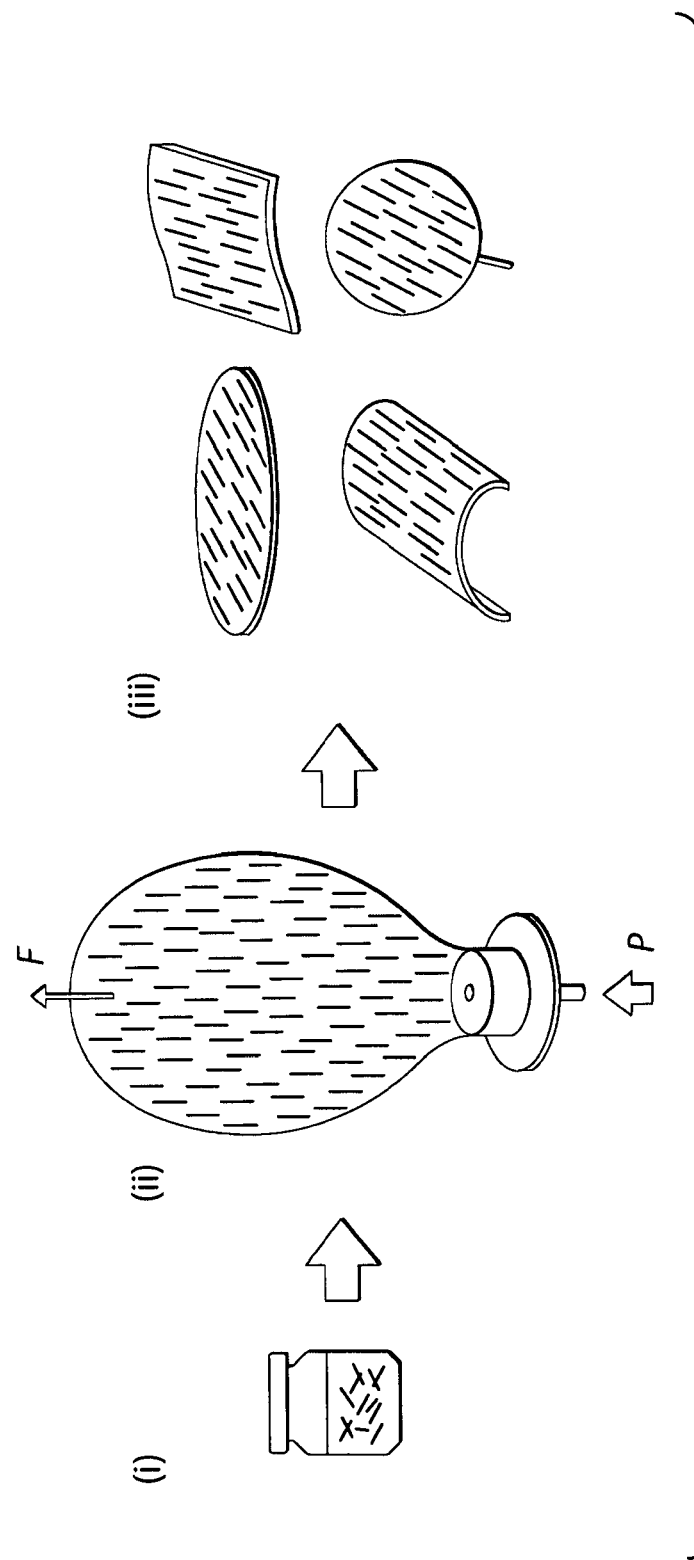
FIGS. 1A-1E illustrate a method of preparing a film of liquid, suspended in air, containing nanowires, in accordance with one embodiment of the invention.

The present invention generally relates to liquid films containing nanostructured materials, and, optionally, the use of this arrangement to organize nanostructures and to transfer the nanostructures to a surface. Liquid films containing nanostructures, such as to nanoscale wires, can be formed in a different fluid, such as a gas, and then transferred to a surface. For example, nanostructures such as nanowires can be provided in a film of a liquid, in a gas such as air, under conditions in which the nanostructures become organized (e.g., nanowires become aligned), and then the film can come into contact with a surface whereby the nanostructures are, transferred to the surface in an organized way, according to their organization in the liquid.

By choosing an appropriate liquid, a liquid film can be expanded, for example to form a "bubble" having a diameter of at least about 5 cm or 10 cm. The size of the bubble can be controlled, in some cases, by controlling the viscosity of the liquid film. In some embodiments, the viscosity can be controlled to be between about 15 Pa s and about 25 Pa s, or controlled using a mixture of an aqueous liquid and an epoxy. In some cases, the film of liquid may be contacted with a surface, which can be used to transfer at least some of the nanostructures to the surface. In some cases, the nanostructures may be transferred as an orderly or aligned array. Once on the surface, the nanostructures may be reacted, etched, layered, etc., e.g., for use in an electric circuit. Other examples of suitable liquids include polymer/solvent systems, for example, systems comprising a polymer that can be dissolved in water and/or ethanol (e.g., polyethylene oxide (PEO) solutions, polyvinyl alcohol (PVA) solutions, ethylene vinyl alcohol (EVOH) solutions, etc.). Other polymers that can be used include various photolithography-compatible polymers, e.g., SU-8 or other UV-radiation curing polymers, for example poly(methyl methacrylate) (PMMA) or polyethylene terephthalate (PET). Yet another example of a suitable polymer is poly(ethylene). One aspect of the invention is directed to providing a film of liquid containing nanostructures such as nanoscale wires. The liquid may be any liquid able to form a film under ambient conditions. For instance, in some cases, the liquid may have a surface tension and/or a viscosity that allows it to form a film of liquid that can be suspended in air (or another gas or fluid, for example, a gas that does not contain oxygen, e.g., $N_2$, $CO_2$, a noble gas, etc.) for example, as a "bubble" or a "sheet." Typically, the film of liquid is immiscible, or at least substantially immiscible, in the fluid containing the film, i.e., the liquid and the fluid remain as distinct phases for at least the time necessary to prepare and manipulate the liquid film within the fluid. In some cases, fairly large bubbles can be formed (e.g., blown, for instance by blowing air, or another gas, into a film of liquid). The bubbles may have a diameter of at least about 5 cm, at least about 10 cm, at least about 15 cm, at least about 20 cm, at least about 25 cm, etc. A non-limiting example of such a system is shown in FIG. 26. In this example, a liquid film containing nanostructures is heated and a funnel is placed on the liquid film. The funnel is then slowly lifted while gas (e.g., air) is blown into the funnel. This causes the liquid film to expand, thereby forming a "bubble" containing the nanostructures.

In some cases, the viscosity of the liquid may be chosen such that it is between about 15 Pa s and about 25 Pa s, or between about 10 Pa s and about 20 Pa s, etc. The viscosity of a liquid can be readily measured by those of ordinary skill in the art, for example, using a rotational rheometer. The liquid may be aqueous or organic, e.g., containing an organic solvent such as tetrahydrofuran. In some cases, the viscosity of the liquid may be controlled using a polymer, for instance, an epoxy, e.g., a thermosetting epoxide polymer that cures (polymerizes) when exposed to a catalyst or a "hardener." During the polymerization process, the viscosity of the liquid may change as the polymer polymerizes, and when the desired viscosity is reached, the liquid can be blown to form a flim of liquid containing the nanostructures. In some cases, the epoxy and/or hardener are chosen such that the viscosity changes occur relatively slowly, e.g., such that the liquid film can be blown and manipulated as desired (e.g., as discussed below), prior to hardening of the epoxy. For instance, the epoxy or other polymer may be chosen such that the liquid reaches the desired viscosity over a time scale of minutes, hours, or days, depending on the application.

Figure 25:
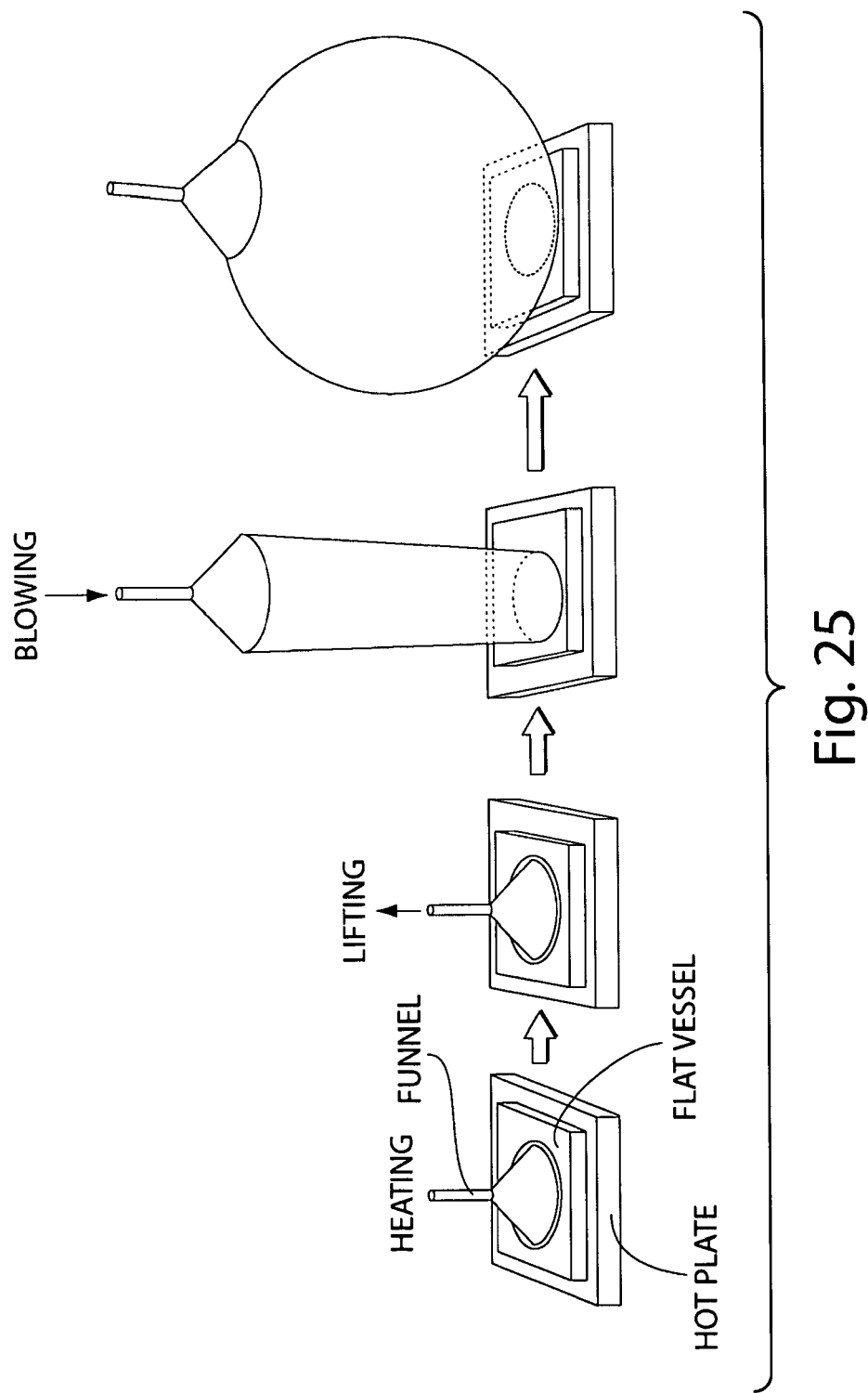
FIG. 25 illustrates an example of a system for forming a film.

As mentioned, the liquid may contain one or more types of nanostructures, e.g., dissolved or suspended in the liquid. As used herein, a "nanostructure" is a solid structure that, at at least one location, has at least one cross-sectional dimension and, in some embodiments, two or three orthogonal cross-sectional dimensions less than 1 micrometers, preferably less than about 500 nm, preferably less than about 200 nm, more preferably less than about 150 nm, still more preferably less than about 100 nm, even more preferably less than about 70, still more preferably less than about 50 nm, even more preferably less than about 20 nm, still more preferably less than about 10 nm, and even less than about 5 nm. In other embodiments, the cross-sectional dimension can be less than 2 nm or 1 nm. Non-limiting examples of nanostructures include particles having nanometer dimensions (e.g., spherical particles, for instance, semiconductor nanoparticles or "quantum dots"), as well as elongated nanostructures such as nanowires, nanotubes, nanorods, nanowhiskers, etc. Typically, the nanostructures are synthetically created, i.e., excluding naturally-occurring particles such as dust. A non-limiting example of a film containing nanoparticles is shown in FIG. 25. In FIG. 25A, a liquid film containing CdS nanoparticles (diameter of about 5 nm) is used to produce a film (scale bar 50 micrometers), while in FIGS. 25B and 25C, SiC nanoparticles (diameter of about 40 nm) are used to produce a film (the scale bar in FIG. 25B is 40 micrometers, and the scale bar in FIG. 25C is 10 micrometers).

As used herein, a "nanotube" (e.g. a carbon nanotube) is generally nanoscopic wire that is hollow, or that has a hollowed-out core, including those nanotubes known to those of ordinary skill in the art. The nanotube may be, e.g., a single-walled nanotube (SWNT) or a multi-walled nanotube (MWNT), and may be produced by any suitable technique known to those of ordinary skill in the art. A "nanowire" (e.g. comprising silicon or another semiconductor material) is a nanoscopic wire that is generally a solid wire. As used herein, an "elongated" article is an article for which, at any point along the longitudinal axis of the article, the aspect ratio, or the ratio of the length of the article to the largest width at that point is greater than 2:1, and in some cases, greater than about 3:1, greater than about 5:1, greater than about 10:1, greater than about 25:1, greater than about 50:1, greater than about 75:1, greater than about 100:1, greater than about 150:1, greater than about 250:1, greater than about 500:1, greater than about 750:1, or greater than about 1000:1 or more.

Non-limiting examples of elongated nanostructures are disclosed in U.S. patent application Ser. No. 09/935,776 now abandoned, filed Aug. 22, 2001, entitled "Doped Elongated Semiconductors, Growing Such Semiconductors, Devices Including Such Semiconductors, and Fabricating Such Devices," by Lieber, et al., published as U.S. Patent Application Publication No. 2002/0130311 on Sep. 19, 2002; and U.S. patent application Ser. No. 10/196,337 now U.S. Pat. No. 7,301,199, filed Jul. 16, 2002, entitled "Nanoscale Wires and Related Devices," by Lieber, et al., published as U.S. Patent Application Publication No. 2003/0089899 on May 15, 2003, each incorporated herein by reference. Also incorporated by reference herein is U.S. Provisional Patent Application Ser. No. 60/850,701, filed Oct. 10, 2006, entitled "Liquid Films Containing Nanostructured Materials," by Lieber, et al.

The nanostructures may be introduced into the liquid (e.g., dissolved or suspended therein), and the liquid can then be blown or formed into liquid bubbles or films using any suitable technique, for example, by dipping a wire frame or a funnel into a solution of liquid, by "blowing" or passing a column of air (or other gas or fluid) into a liquid solution, etc. In some embodiments, the blowing of air into the liquid film may be performed manually by a human. As mentioned, through suitable choice of the liquid, bubbles formed in such a manner may have a diameter of at least about 5 cm, at least about 10 cm, at least about 15 cm, at least about 20 cm, at least about 25 cm, etc. Similarly, films of liquid may be formed having a height and/or width of at least about 5 cm, at least about 10 cm, at least about 15 cm, at least about 20 cm, at least about 25 cm, etc. The film may be flat or planar, or non-planar in some cases. For example, a wireframe dipped into a solution containing nanostructures may result in liquid films of varying shapes that are defined by the wireframe.

If elongated nanostructures are used (e.g., nanowires, nanotubes, nanorods, nanowhiskers, etc.), in some cases, the film of liquid may be used to align or otherwise organize the elongated nanostructures. Without wishing to be bound to any theory, it is believed that the film of liquid contains tensile stresses that causes the nanostructures to become aligned or otherwise organized. For instance, in a bubble, tensile stresses may be created along the direction that the bubble is being blown, thereby causing the elongated nanostructures within the bubble to become aligned, for example, radially outward from the point where the bubble is blown.

The film of liquid may also be contacted with a surface in some embodiments of the invention, thereby transferring at least some of the nanostructures to the surface. In some cases, the pattern of nanostructures on the surface may correspond, at least in part, to the pattern of nanostructures within the film. Thus, the organization of nanostructures within the film, in certain embodiments, has an effect on the final organization of the nanostructures transferred to the surface from the film. In one embodiment, the organization of the nanostructures within the film is identical, or at least substantially identical, to the organization of the nanostructures on the surface.

Figure 9A:
FIGS. 9A-9B illustrate the use of a curved substrate, in one embodiment of the invention.
Figure 10A:
FIGS. 10A-10B illustrate the use of a curved substrate, in another embodiment of the invention.
Figure 10B:
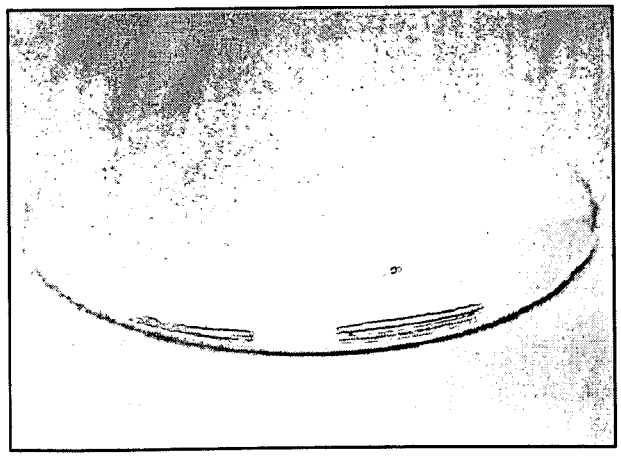
Figure 11A:
FIGS. 11A-11B illustrate the use of a semiconductor wafer as a substrate, in one embodiment of the invention.
Figure 11B:
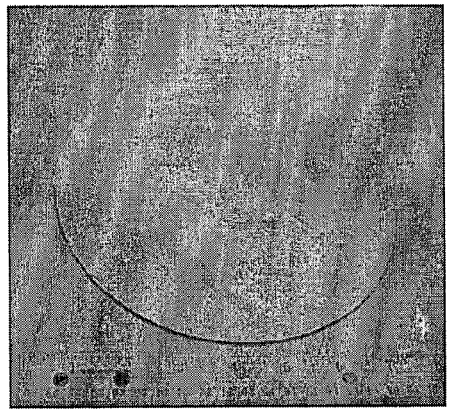
Figure 12A:
FIGS. 12A-12B illustrate the use of a flexible plastic as a substrate, in another embodiment of the invention.
Figure 12B:

The surface may be planar or nonplanar in some cases. For example, the surface may have a shape that complements the shape of the film or bubble of liquid, which may facilitate uniform transfer of the nanostructures. Non-limiting examples include curved or "U" shaped substrates (e.g., FIGS. 9A-9B), concave substrates (e.g., FIG. 10A-10B), or the like. The surface may be formed of any suitable material, such as glass, a semiconductor such as silicon (e.g., as shown in FIG. 11A-11B), a polymer (e.g., a flexible plastic, as is shown in FIG. 12A-12B, for instance, Kapton), a metal (which may be planar or nonplanar, e.g., curved, ridged, corrugated), etc., depending on the particular application. In some cases, after contacting the film of liquid to the surface, the film of liquid is removed (e.g., mechanically, for example, by "sweeping" with a rod), or in some cases, allowed to "pop."

Figure 13A:
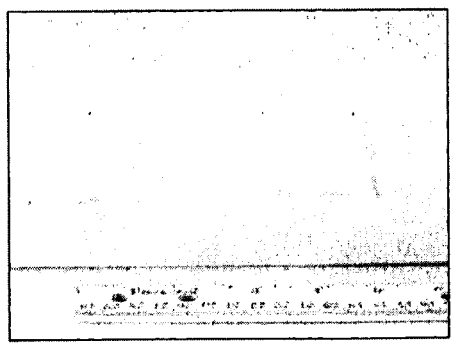
FIGS. 13A-13B illustrate the "scrolling" of a liquid film, in yet another embodiment of the invention.
Figure 13B:
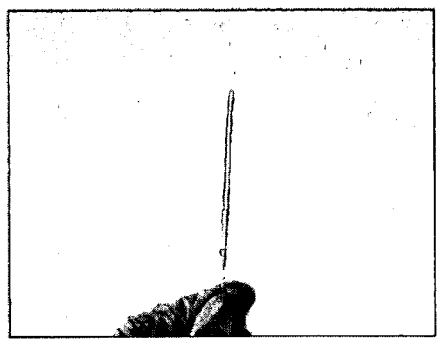

Additionally, in some cases, the film or bubble can be "folded," "rolled" or "scrolled" up, e.g., to produce a layered or a three-dimensional structures (e.g., as is shown in FIG. 13A-13B). Thus, in one embodiment, a first portion of a film or bubble may be contacted or superpositioned with a second portion of the film or bubble (or of a different film or bubble). The superpositioning may be performed such that the nanostructures in each portion are aligned relative to each other (e.g., all of the nanostructures remain parallel), or such that the nanostructures are aligned in different orientations relative to each other, for instance, such that the nanostructures are perpendicular, which may be useful in forming a crossbar array, such as those described in <70112>, incorporated herein by reference. Further "folds" may be used in some embodiments. For instance, a second portion may be interfaced with a first portion of a film or bubble, then a third portion of the film or bubble (or of a different film or bubble) interfaced with the second portion, etc.

Figure 18A:
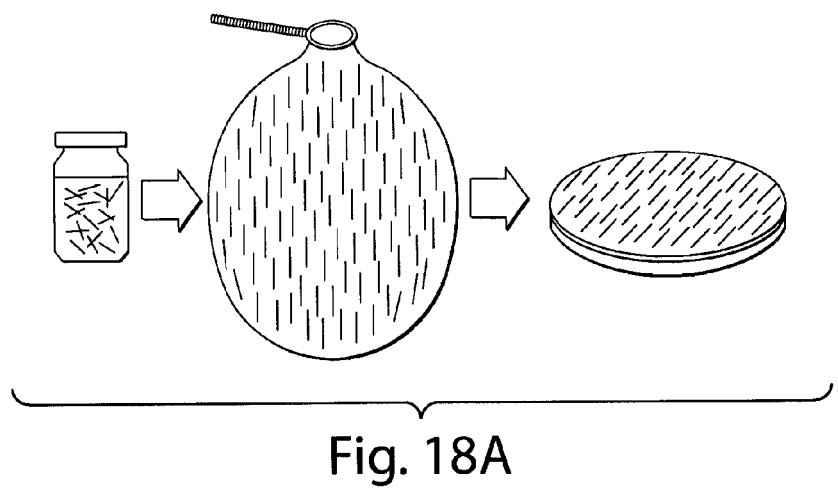
FIGS. 18A-18B illustrate methods of films containing nanowires, in accordance with another embodiment of the invention.

The density of nanostructures on the surface may be controlled, for example, by controlling the density of nanostructures in solution, prior to forming the film or bubble, by controlling the size of the film or bubble, etc. A non-limiting example of this is illustrated schematically in FIG. 18A, where a liquid film containing nanostructures such as nanowires is contacted with a substrate.

Figure 23A:
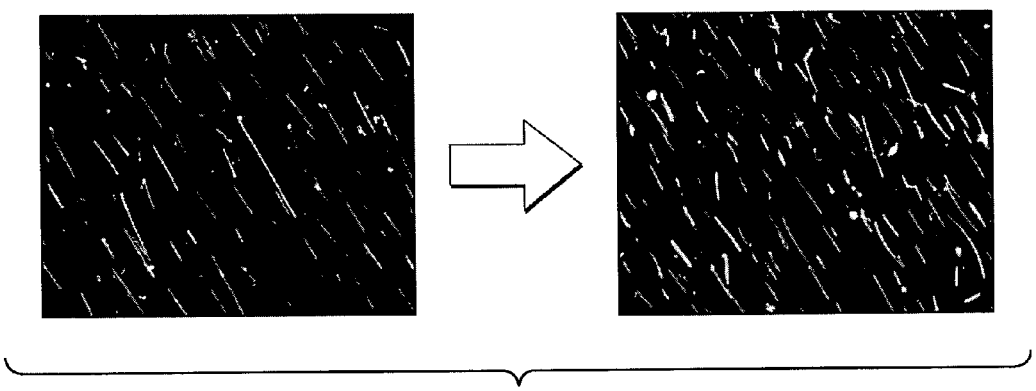
FIGS. 23A-23D illustrate the transfer of nanostructures onto a substrate, according to one embodiment of the invention.
Figure 23B:
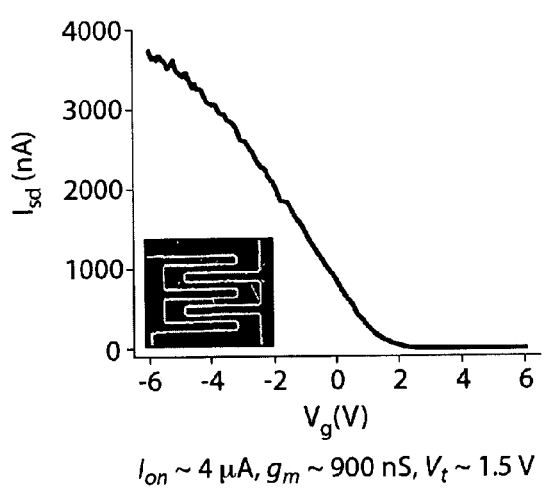
Figure 23C:
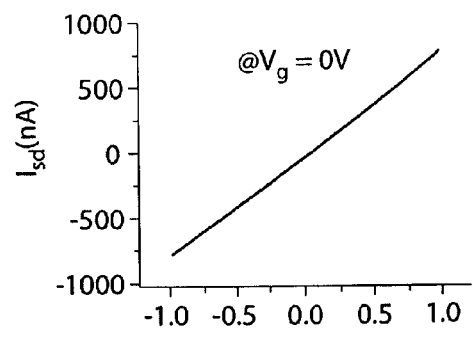
Figure 23D:
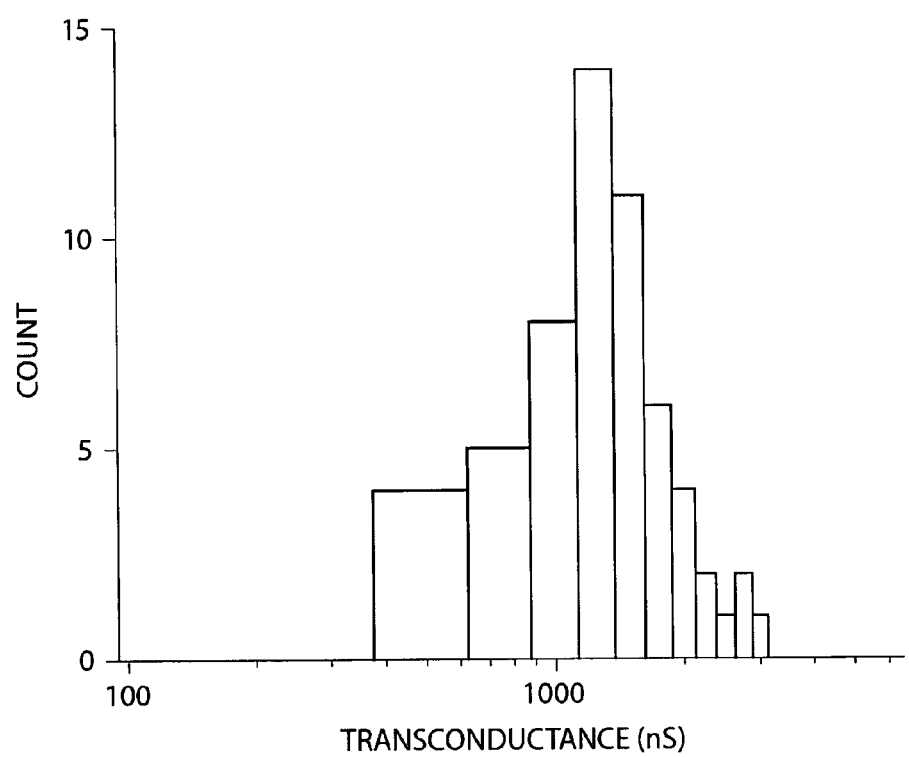
Figure 24A:
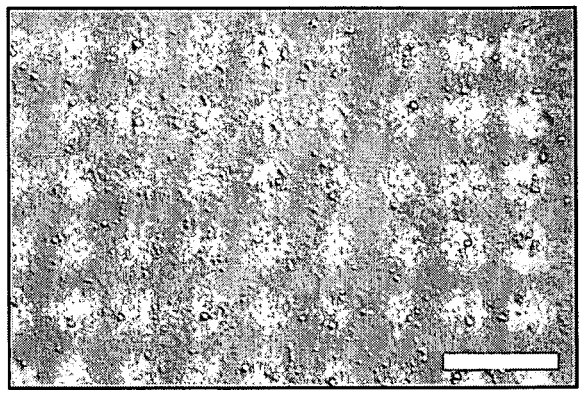
FIGS. 24A-24C illustrate nanoparticles in a film, according to another embodiment of the invention.
Figure 24B:
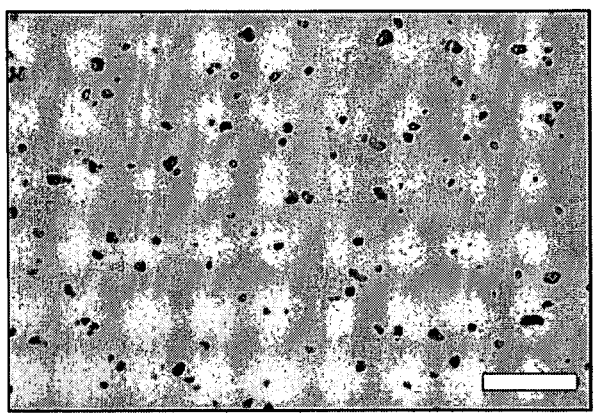
Figure 24C:
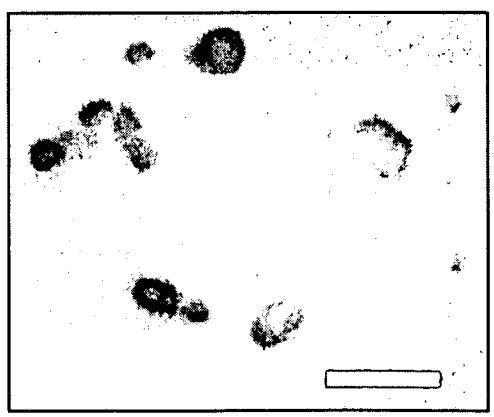

In some cases, the transfer of nanostructures such as nanowires and/or nanotubes, particles, etc., from the film to the surface may be facilitated by the application of heat. For instance, the substrate may be heated to temperatures of at least about 100° C., at least about 150° C., or at least about 200° C. to facilitate the transfer. A non-limiting example is shown with reference to FIG. 23. In this figure, nanowires contained within a poly(methyl methacrylate) film are transferred onto a surface by heating the film for 200° C. for 10 min, rinsing with acetone, and cleaning with plasma. As can be seen, the nanowires stay substantially aligned during this process. The nanowires may then be further developed, e.g., using photolithography, etc., to produce an electrical device. FIG. 23B illustrates an example of a device fabricated according to this method. The device can be seen in the inset in FIG. 24B. FIGS. 24B and 24C are I-V plots of a typical device, while FIG. 24D is a histogram of transconductance values of a plurality of such devices produced according to this method, showing device uniformity.

In certain cases where elongated nanostructures are used, the elongated nanostructures may become aligned, as discussed above, such that the nanostructures are transferred to the surface in an aligned fashion. For example, after transferring the nanostructures to the surface, at least about 90%, at least about 95%, or at least about 99% of the aligned nanoscale wires on the surface have an average deviation of no more than about 20° or 10° from the average direction of the axes of each of the aligned nanoscale wires.

Once on the surface, the nanostructures can be used in any subsequent application where nanostructures on a surface are desired. For example, in one embodiment, at least some of the nanostructures may be connected to form an electric circuit, e.g., in combination with other electric components. The electric components may be applied to the nanostructures using any suitable technique, for instance, photolithography, nanoimprinting, etc. In another set of embodiments, a film of nanostructures, such as nanotubes, may be used as a film, for example, in electromagnetic interference shielding materials or antistatic coatings.

Figure 18B:
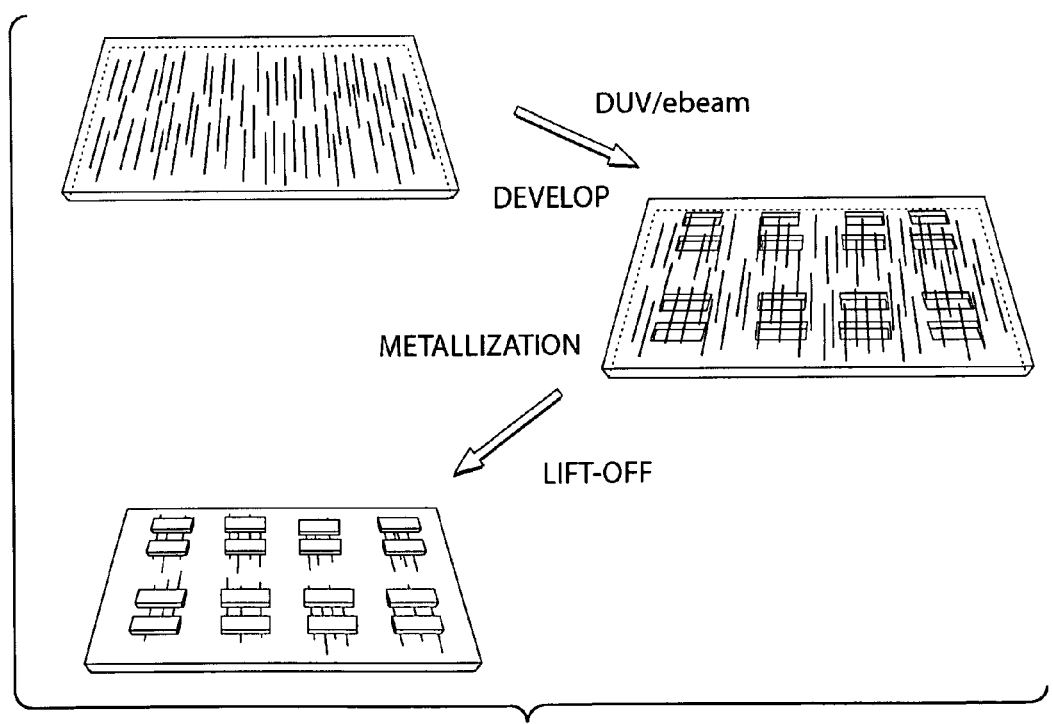
Figure 19A:
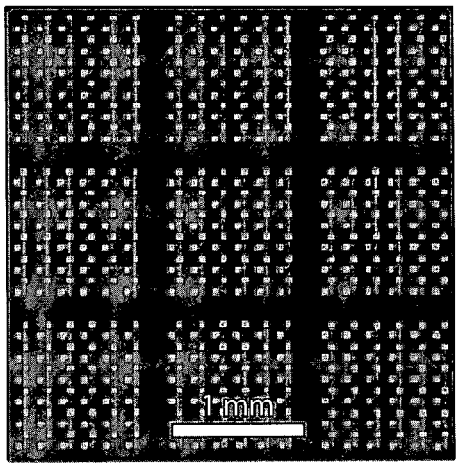
FIGS. 19A-19D illustrate certain devices formed in accordance with one embodiment of the invention.
Figure 19B:
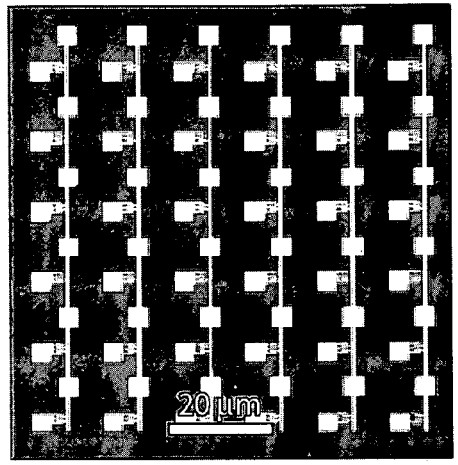
Figure 19C:
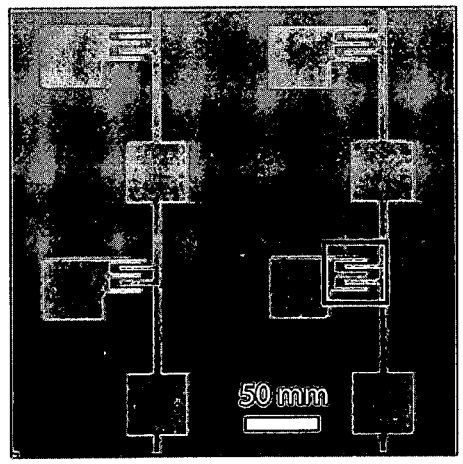
Figure 19D:
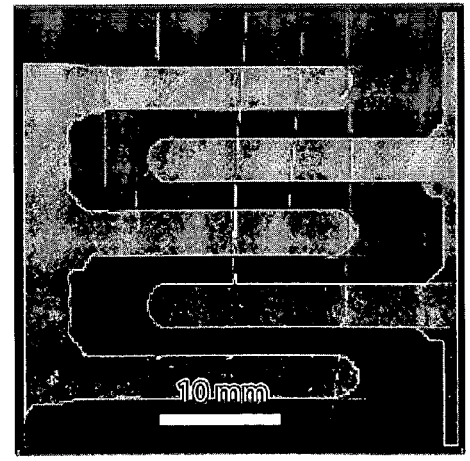
Figure 20A:
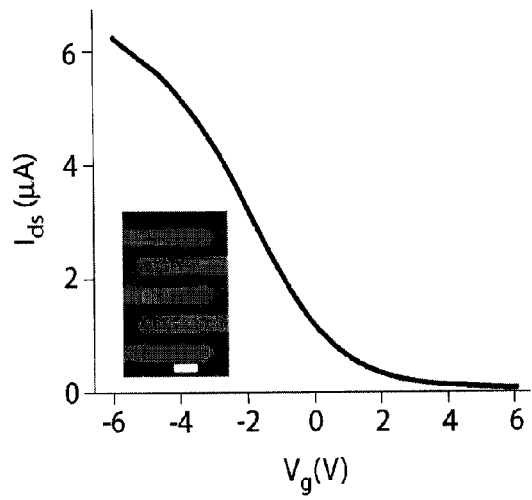
FIGS. 20A-20C illustrate electrical characteristics of the devices of FIG. 19.
Figure 20B:
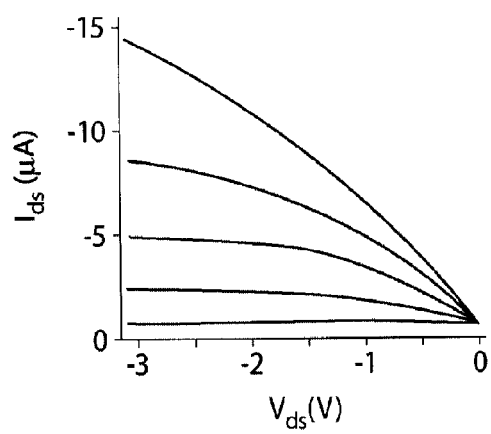
Figure 20C:
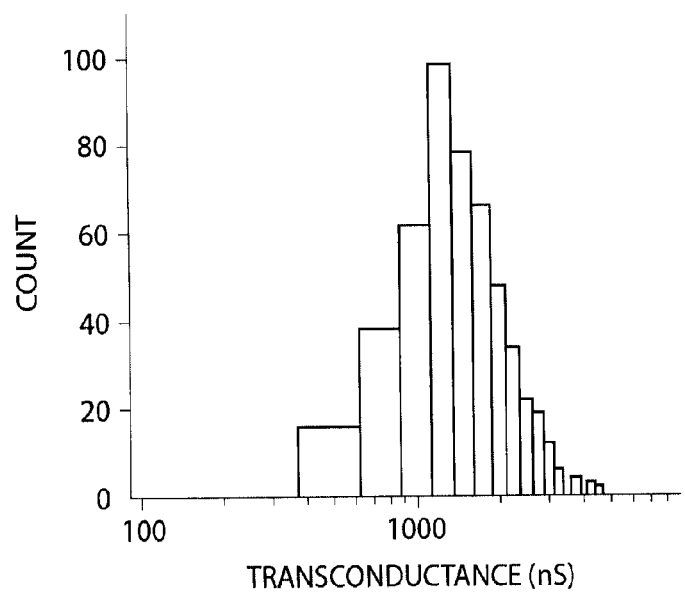
Figure 21A:
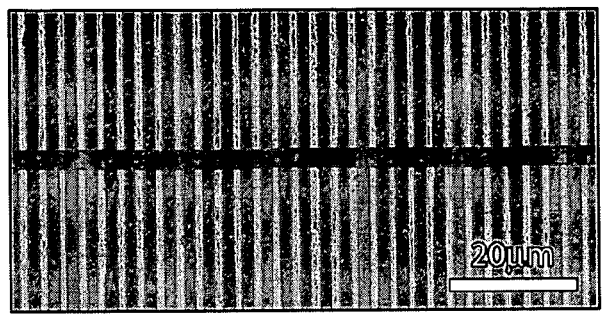
FIGS. 21A-21H illustrate certain devices using silicon nanowires, formed in accordance with another embodiment of the invention.
Figure 21B:
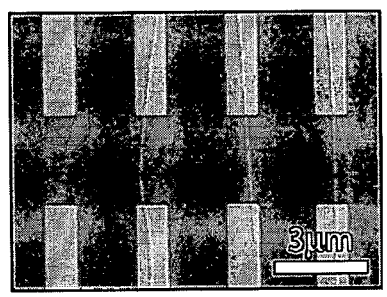
Figure 21C:
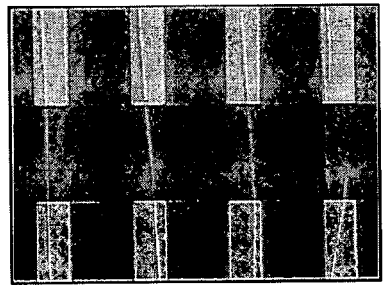
Figure 21D:
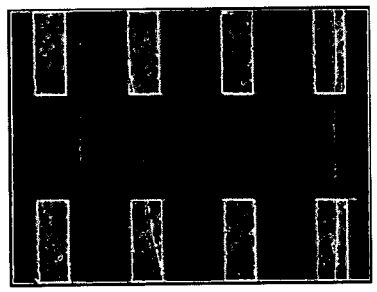
Figure 21E:
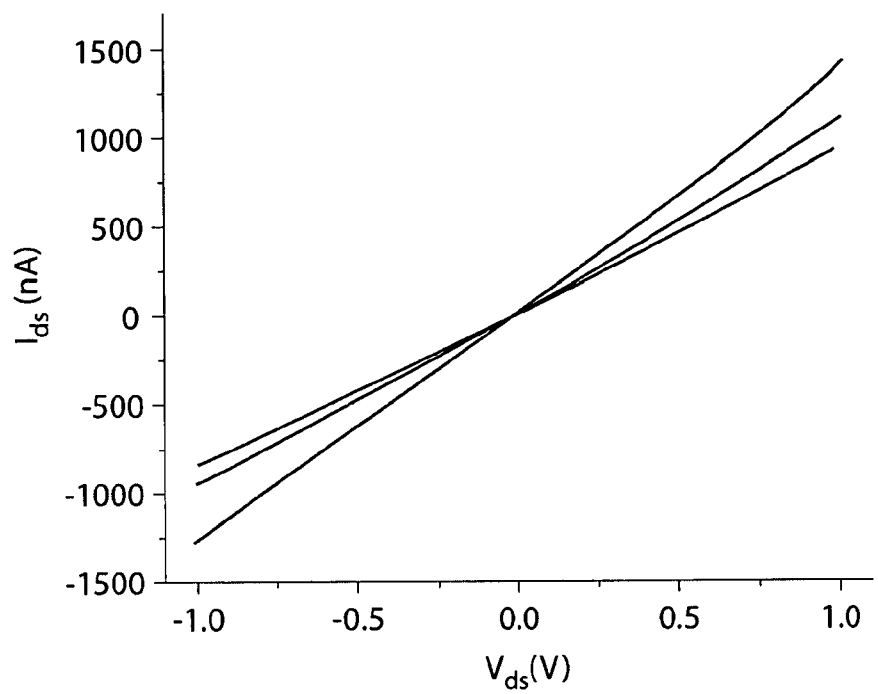
Figure 21F:
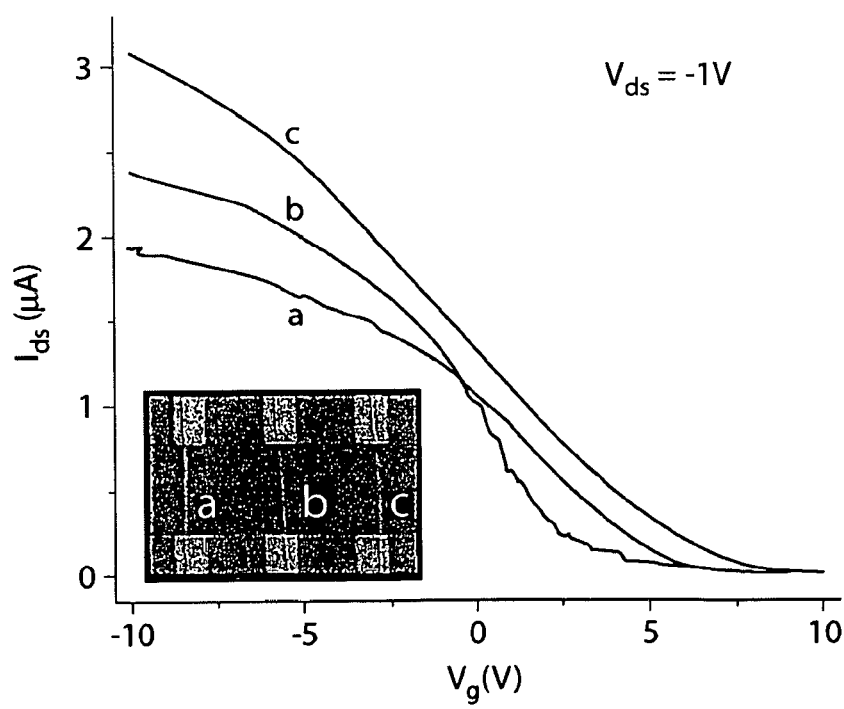
Figure 21G:
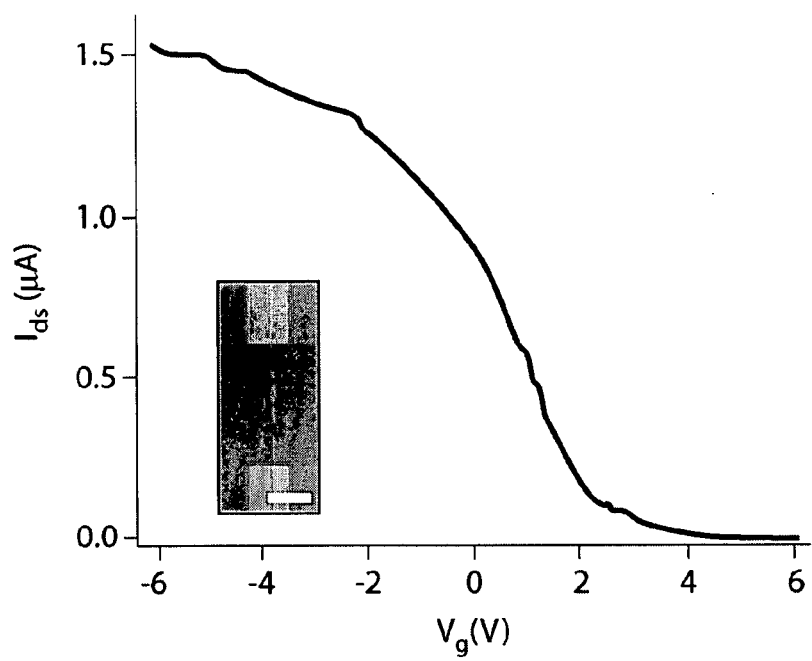
Figure 21H:
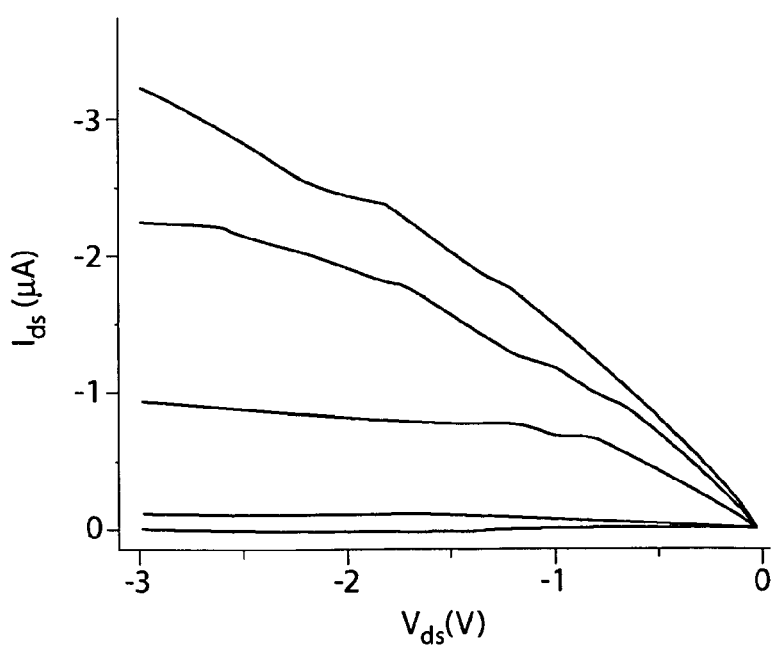
Figure 22A:
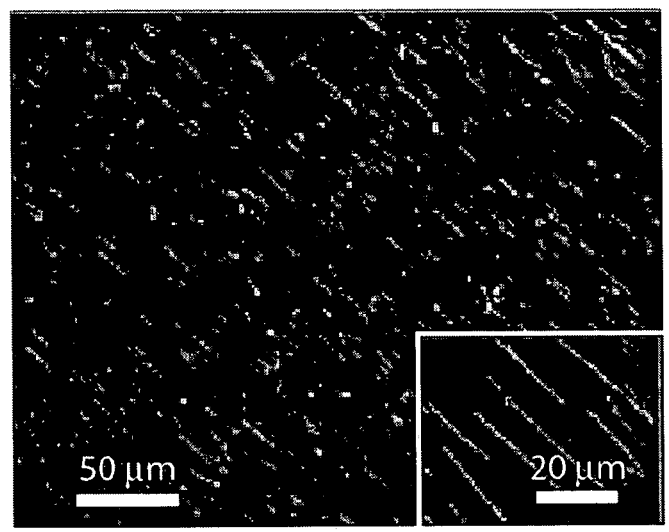
FIGS. 22A-22D illustrate certain devices using multi-walled nanotubes, formed in accordance with yet another embodiment of the invention.
Figure 22B:
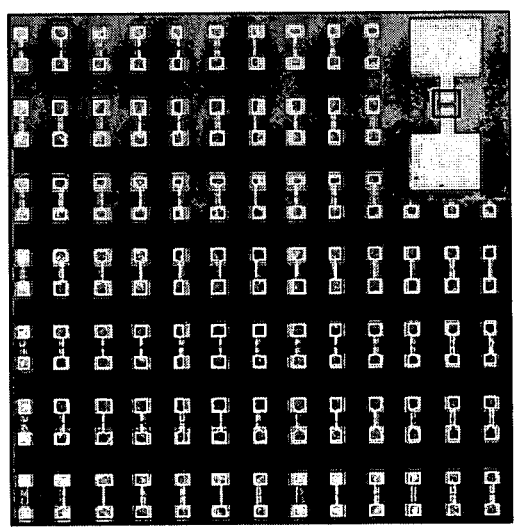
Figure 22C:
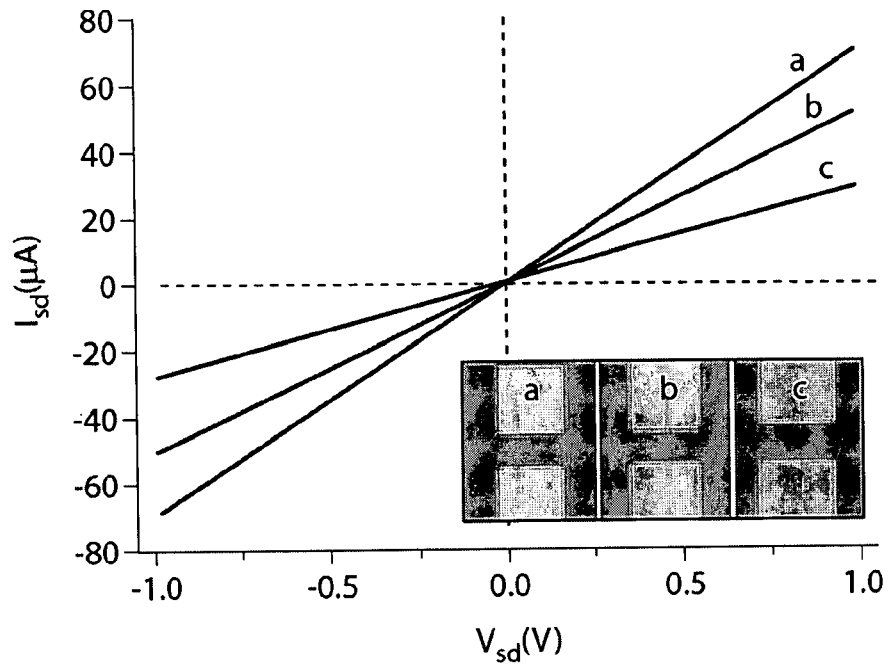
Figure 22D:
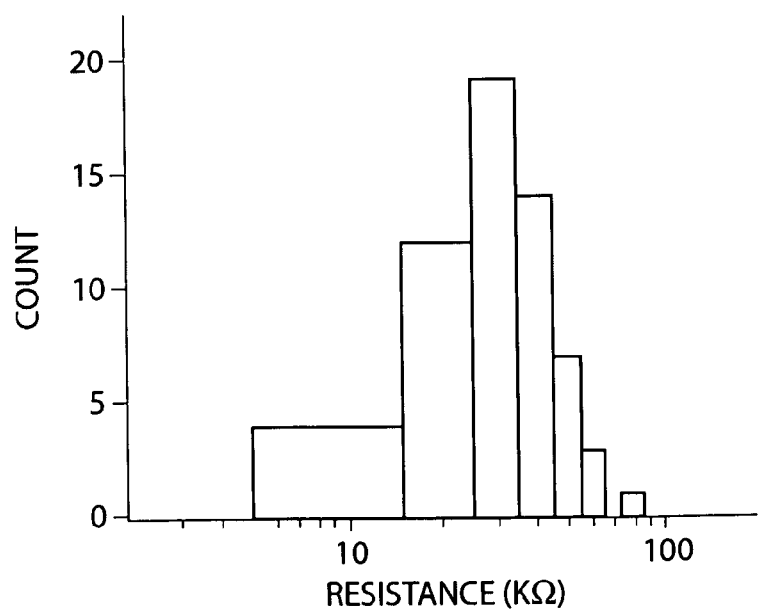

As an example, the nanostructures on the surface may be formed into an electrical circuit using techniques known to those of ordinary skill in the art, for instance, techniques such as lithography (e.g., e-beam or DUV lithography). A non-limiting schematic diagram is shown in FIG. 18B. In this figure, a surface containing nanostructures may be processed using techniques such as lithography, metallized, etc. to produce one or more electronic devices. Non-limiting examples of such devices are shown in FIG. 19, which is a device containing arrays of electrodes connected by nanowires (FIGS. 19A-19D show the same device at successively increasing levels of magnification using SEM; the nanowires themselves cannot be readily identified until the highest levels of magnification are reached; see FIG. 19D). The performance of the devices shown in the example of 19A are shown in FIG. 20. FIGS. 20A-20B illustrate typical output and transfer curves, while FIG. 20C is a histogram of transconductance values measuring using these devices, showing substantial uniformity in transconductance.

Another non-limiting example of a device is shown in FIG. 21. FIG. 21A shows an SEM image of 30 parallel device arrays, produced using techniques similar to those described above. The channel length is 3 micrometers and the width is 1 micrometer. The array pitch is also 3 micrometers. FIGS. 21B-21D are expanded views of the channel region, showing that the contact yield of the silicon nanowires in this particular example was about 50%. This is not optimized in this example, and can be improved using routine techniques known to those of ordinary skill in the art. FIGS. 21E-21F illustrate the typical output and transfer curves of a single device, while FIGS. 21G and 21H illustrate I-V curves recorded from three such devices (FIG. 21G), and the corresponding gate sweep curves using a 50 nm oxide back gate (FIG. 21H).

Yet another non-limiting example is shown in FIG. 22 for multi-walled nanotubes. FIG. 22A is a dark field optical image of aligned multi-walled nanotubes in a poly(methyl methacrylate) film, while FIG. 22B is a bright field optical image of an array of devices produced using this film. FIG. 22C shows the performance of three of these devices, with linear I-V curves, while FIG. 22D is a histogram of the resistances of these devices, showing substantial uniformity.

Additionally, in some cases, more than one layer of nanostructures may be added to a surface. For example, a first layer containing aligned elongated nanostructures such as nanowires may be deposited onto a surface, and a second layer containing aligned elongated nanostructures (which may or may not be identical to the elongated nanostructures of the first layer) may be deposited onto the first layer. The first and second layers may each be aligned, or in some cases, the layers may be crossing, for example, perpendicularly. See, e.g., U.S. patent application Ser. No. 10/033,369, filed Oct. 24, 2001, entitled "Nanoscopic Wire-Based Devices and Arrays," by Lieber, et al., now U.S. Pat. No. 6,781,166, issued Aug. 24, 2004, incorporated herein by reference, for an example of an electric circuit comprising crossed nanowires. Further layers (e.g., of elongated nanostructures) can also be added as desired, depending on the particular application, in some cases forming a 3-dimensional network.

The following documents are incorporated herein by reference in their entirety for all purposes, and include additional description of teachings usable with the present invention: U.S. patent application Ser. No. 09/935,776 now abandoned, filed Aug. 22, 2001, entitled "Doped Elongated Semiconductors, Growing Such Semiconductors, Devices Including Such Semiconductors, and Fabricating Such Devices," by Lieber, et al., published as U.S. Patent Application Publication No. 2002/0130311 on Sep. 19, 2002; U.S. patent application Ser. No. 10/033,369, filed Oct. 24, 2001, entitled "Nanoscopic Wire-Based Devices and Arrays," by Lieber, et al., published as U.S. Patent Application Publication No. 2002/0130353 on Sep. 19, 2002, now U.S. Pat. No. 6,781,166, issued Aug. 24, 2004; U.S. patent application Ser. No. 10/020,004 now U.S. Pat. No. 7,129,554, filed Dec. 11, 2001, entitled "Nanosensors," by Lieber, et al., published as U.S. Patent Application Publication No. 2002/0117659 on Aug. 29, 2002; U.S. patent application Ser. No. 10/152,490 now abandoned, filed May 20, 2002, entitled "Nanoscale Wires and Related Devices," by Lieber, et al.; U.S. patent application Ser. No. 10/196,337 now U.S. Pat. No. 7,301,199, filed Jul. 16, 2002, entitled "Nanoscale Wires and Related Devices," by Lieber, et al., published as U.S. Patent Application Publication No. 2003/0089899 on May 15, 2003; U.S. patent application Ser. No.

10/720,020 now abandoned, filed Nov. 21, 2003, entitled "Nanoscale Wires and Related Devices," by Lieber, et al., published as U.S. Patent Application Publication No. 2003/0089899 on May 15, 2003; U.S. patent application Ser. No. 10/812,653 now U.S. Pat. No. 8,178,907, filed Mar. 29, 2004, entitled "Nanoscopic Wire-Based Devices and Arrays," by Lieber, et al., published as U.S. Patent Application Publication No. 2004/0188721 on Sep. 30, 2004; U.S. patent application Ser. No. 10/973,665 now abandoned, filed Oct. 26, 2004, entitled "Nanoscopic Wire-Based Devices and Arrays," by Lieber, et al., published as U.S. Patent Application Publication No. 2005/0117441 on Jun. 2, 2005; U.S. patent application Ser. No. 10/995,075 now abandoned, filed Nov. 22, 2004, entitled "Nanoscale Arrays and Related Devices," by Whang, et al., published as U.S. Patent Application Publication No. 2005/0253137 on Nov. 17, 2005; U.S. patent application Ser. No. 11/058,443 now abandoned, filed Feb. 14, 2005, entitled "Nanoscale Wires and Related Devices," by Lieber, et al.; International Patent Application No. PCT/US2005/004459, filed Feb. 14, 2005, entitled "Nanostructures Containing Metal-Semiconductor Compounds," by Lieber, et al., published as WO 2005/093831 on Oct. 6, 2005; U.S. patent application Ser. No. 11/137,784 now abandoned, filed May 25, 2005, entitled "Nanoscale Sensors," by Lieber, et al.; U.S. Provisional Patent Application Ser. No. 60/707,136, filed Aug. 9, 2005, entitled "Nanoscale Sensors," by Lieber, et al.; U.S. Provisional patent application Ser. No. 60/790,322, filed Apr. 7, 2006, entitled "Nanoscale Wire Methods and Devices," by Lieber, et al.; U.S. Provisional Patent Application Ser. No. 60/812,884, filed Jun. 12, 2006, entitled "Nanosensors and Related Technologies," by Lieber, et al.; and; U.S. patent application Ser. No. 11/501,466 now abandoned, filed Aug. 9, 2006, entitled "Nanoscale Sensors," by Lieber, et al.

The following examples are intended to illustrate certain embodiments of the present invention, but do not exemplify the full scope of the invention.

EXAMPLE 1

This example illustrates one approach, according to an embodiment of the invention, for large-area organizations of nanostructures, such as nanowires and carbon nanotubes, involving bubble expansion of homogeneous nanostructure-containing epoxy suspensions. Also shown is that nanostructures such as nanoscale wires can be uniformly aligned in a bubble film with a controlled density, depending on the suspension concentration, and that the bubble films can be readily transferred to a variety of substrates for further device fabrication.

FIG. 1A illustrates one process of bubble blowing for making films embedded with nanostructures such as nanowires or carbon nanotubes. The first step shown in FIG. 1A is to make a homogeneous bubble solution to be used in the blown film. The nanostructures are homogeneously distributed (e.g., dissolved or suspended) within the liquid. This may, in some cases, require functionalization of the nanostructures to form a stable and uniform solution. Taking silicon nanowires (SiNW) as a specific, but non-limiting, example, a set of solutions of well-dispersed functionalized SiNWs in an epoxy solution were prepared at different loading percentages of 0.01 wt %, 0.03 wt %, and 0.15 wt %, respectively (FIG. 1B, left to right showing increasing concentration).

After the curing process reached the desired viscosity range of the solution of between about 15 Pa s and about 25 Pa s, a cable wire with an open ring was dipped into the epoxy-nanowire solution. Other shapes could have been used as well. A membrane formed, covering the ring, which was then blown into a single bubble having a generally spherical shape. Here, the bubble diameter generally reached more than about 20 cm (FIG. 1C) or 25 cm by manual blowing, but it is possible to blow much larger bubbles (e.g. several feet in diameter) by employing techniques such as blown film extrusion, for instance, from a compact die, as is known to those of ordinary skill in the art and is often currently used in industry. With a 10 ml epoxy-SiNW solution, over 100 bubbles (diameter >25 cm) could be blown, thus, each bubble consumed less than about 0.1 ml of solution.

Figure 1B:
Figure 1C:
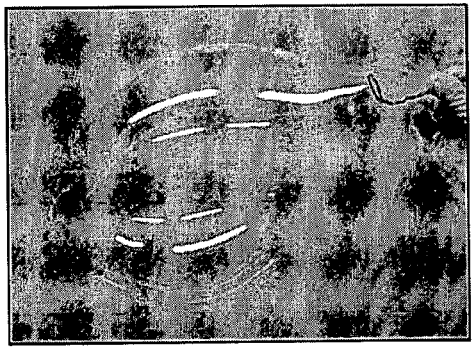
Figure 1D:
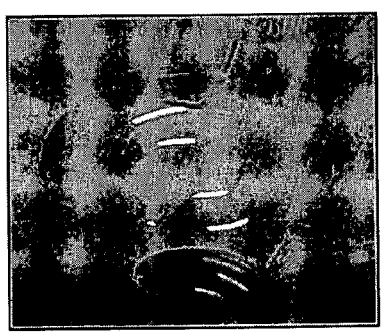
Figure 1E:
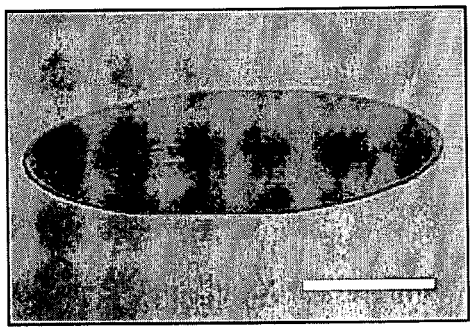

A smooth transfer of bubble film to wafers was performed by blowing the bubble facing a substrate (e.g., a wafer) and allowing the bubble to expand smoothly until covering the whole surface, while keeping the ring-to-wafer distance approximately constant (e.g., about 15 cm to about 20 cm) (FIG. 1D). The bubble, just after blowing, usually maintained its shape for more than about 30 seconds before it begins to sag, thus allowing sufficient time for bubble film to be transferred manually to other substrates. The rest of the film, not touching the substrate, was swept away by a glass rod. Simultaneous blowing and transferring generated uniform film coatings on the whole wafer with either no defects or sometimes very little defects (e.g. tiny gas bubbles trapped between the film and wafer) (see, for example, FIG. 1E, showing a 3 inch silicon wafer). The scale bar is 1 inch.

Figure 5A:
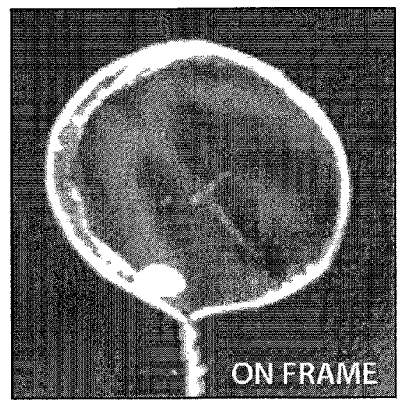
FIGS. 5A-5C illustrate various films of liquids containing nanostructures, in various embodiments of the invention.
Figure 5B:
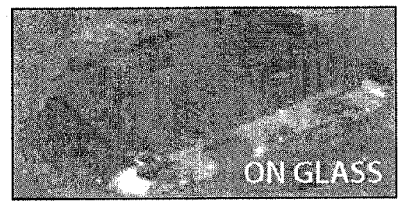
Figure 5C:
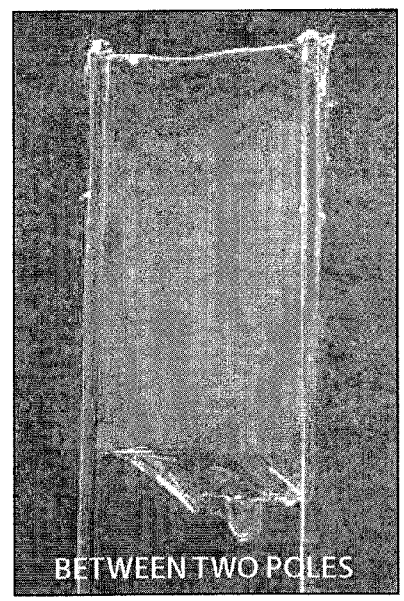

The bubble film can also be transferred to other substrates and surfaces either as freestanding skins or coatings, such as suspending on a hollow frame or between poles, or coating on polished glass slides (see FIG. 5 for bubbled films transferred onto different substrates, including a circular frame, glass, and suspending between two poles). Scanning electron microscopy (SEM) characterization of the cross section of a broken film shows that the bubble process produced uniform film thicknesses in each bubble (FIG. 6). In FIG. 6, a freestanding bubble film and a 500 nm thick film coated on a planar substrate (silicon wafer) are shown. For different bubbles, a thickness range of about 150 nm to about 500 nm was observed; the fluctuation may have been caused by the difference between the amount of dipped solution on the ring and the final size each time when a bubble was blown. Of course, more uniform film thicknesses can be achieved by further, routine process optimization.

EXAMPLE 2

Figure 2E:
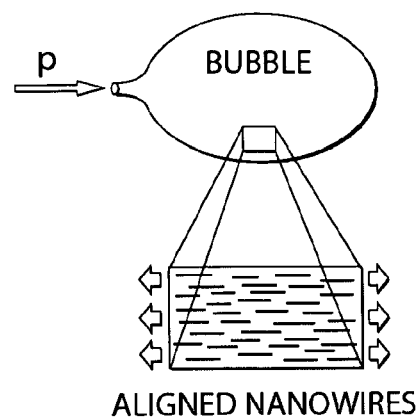

By blowing a bubble solution loaded with functionalized SiNWs, aligned SiNWs were observed on a 3 inch substrate (FIG. 2A) pointing in nearly the same direction, i.e., the blowing direction, with very small angular deviation, less than 10° over the entire wafer. FIG. 2A shows a bubble film coated on a 3 micrometer wafer shows consistent alignment of SiNWs (with very small angular deviation) over the entire wafer surface.

This large scale uniformity and alignment can be further achieved on much larger area substrates if applying standard blowing techniques known to those of ordinary skill in the art.

Figure 2F:
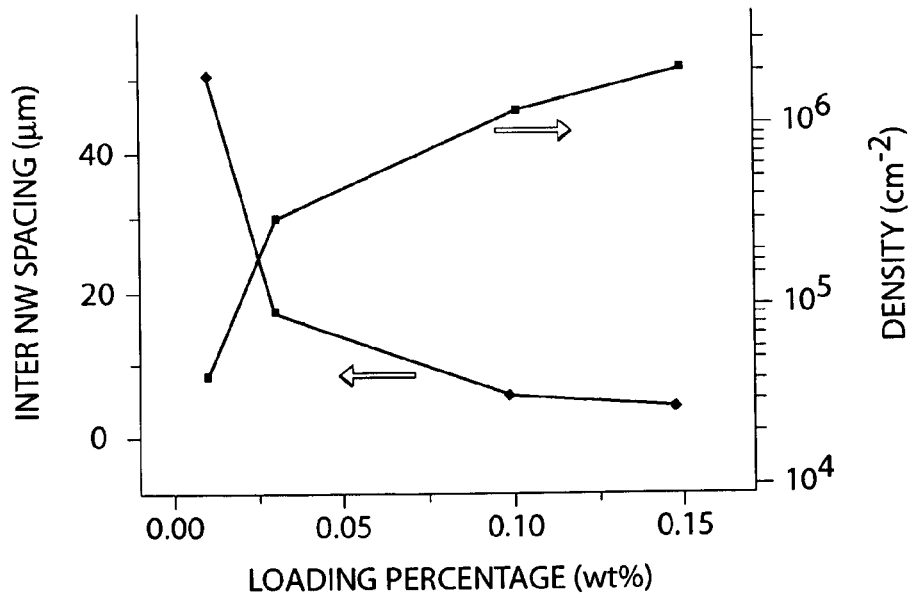

More significantly, the average nanowire (NW) separation can be systematically controlled by adjusting the loading percentage of NWs in the bubble solution, e.g. from tens down to a few micrometers. Representative images of well-aligned NWs with spacings of about 50 micrometers, about 16 micrometers, and about 6 micrometers, as shown in FIG. 2B-D, were obtained on samples blown from bubble solutions with loadings of 0.01 wt %, 0.03 wt %, and 0.10 wt %, respectively. FIG. 2F summarizes the relationship between the NW spacing, area density and loading weight percentage.

This figure shows a plot of calculated inter-NW spacing and area density depends on the NW loading percentage. However, a nanowire distance of 5 micrometers and area density of $2 \times 10^6$ cm$^{-2}$ could be achieved by a NW loading of 0.15%. In FIG. 2F, the average spacings shown from left to right are 50 micrometers, 16 micrometers, and 6 micrometers, respectively, which corresponded to samples with loading percentages of 0.01 wt %, 0.03 wt %, and 0.10 wt %. The highest loading percentage of 0.15 wt % in these experiments yielded an average NW separation of 4.5 micrometers. The NW separation could be further decreased by higher loading percentages. By counting the number of nanowires in a typical area of 100×100 micrometers$^2$, the estimated area density of NWs was determined to be $2 \times 10^6$ cm$^{-2}$, which corresponded to an average NW spacing 4.5 micrometers.

This level of uniformity, alignment, and density thus shows applications such as NW field-effect transistor arrays and optically active thin films based on photoluminescent nanowires. As an example, it was demonstrated in this example that a large scale optical-active film could be produced by blowing the bubble solution containing a large amount of photoluminescent CdS NWs (FIG. 7A). The optical images of both the solution and the bubbled film illuminating green light under UV light excitation are shown in this figure. A representative optical image shows the CdS NWs thin film coated plastic glowed with green light under UV excitation (FIG. 7B). Confocal scanning micrographs (FIG. 7C) were used to further analyze the distribution of CdS NWs within the bubble film and it was shown that the CdS NWs were well-aligned over large areas. The confocal images showed aligned CdS NW arrays with green light emission by UV scanning over the film. The substitution of different NWs can further be very attractive for creating different functional nanosystems.

The observed alignment of nanowires is believed to arise from the tensile stress developed in the blown film during bubble expansion. Without wishing to be bound by any theory, it is believed that in an equilibrium condition where a bubble undertakes slow expansion, a tensile stress is induced within the film and perpendicular to the film section, leading embedded nanowires to align in the same direction to minimize the stress field (schematically shown in FIG. 2E.)

EXAMPLE 3

Figure 3A:
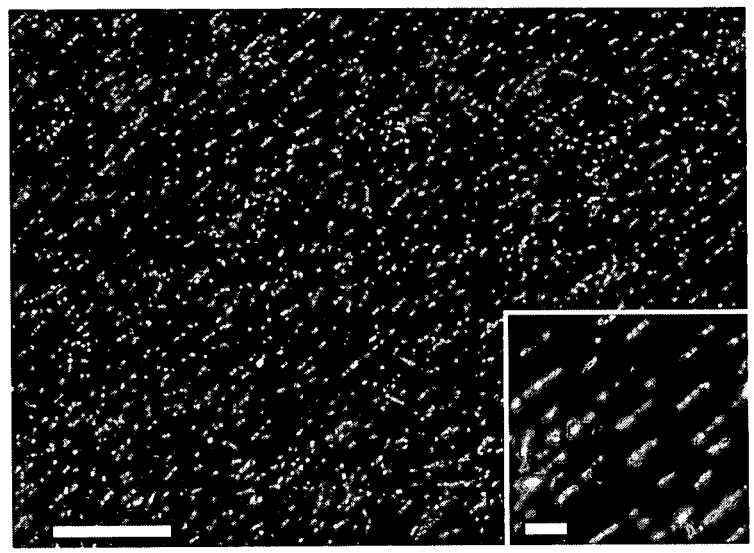
FIGS. 3A-3C illustrate the alignment of nanotubes, in still another embodiment of the invention.
Figure 3B:
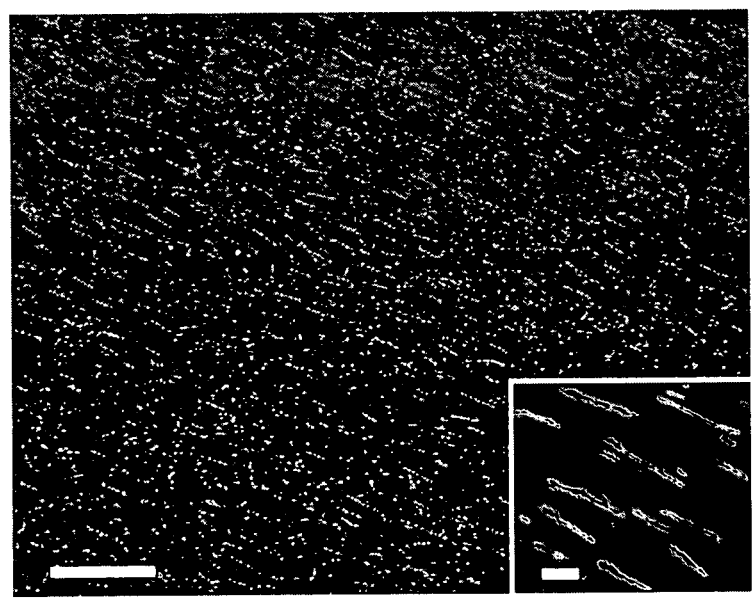
Figure 8:
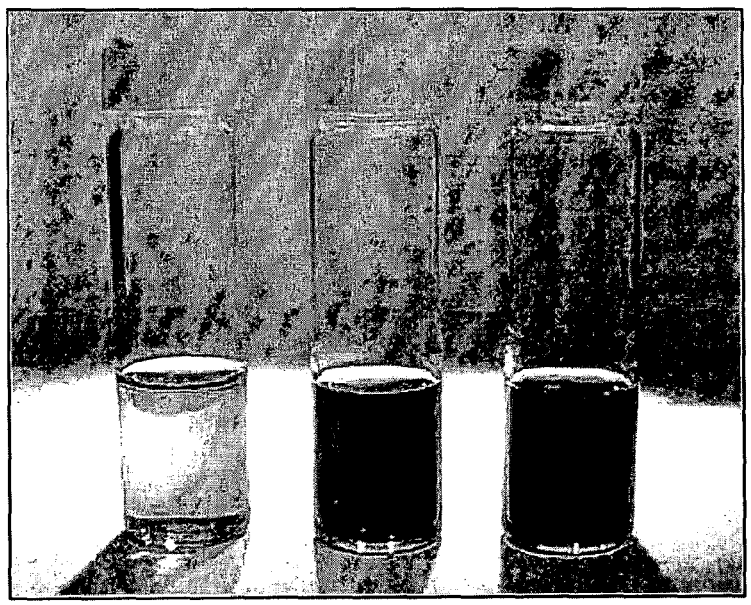
FIG. 8 is a photomicrograph of various solutions containing nanostructures, which can be used to form films of liquid, according to still another embodiment of the invention.

The generality of the above methods is further shown in this example, using carbon nanotubes. Nanotubes are structurally flexible and have strong tendency to entangle and agglomerate. Single-walled nanotubes (SWNTs) were functionalized with n-octadecylamine (ODA) to obtain a well-dispersed SWNT bubble solution, using known procedures (FIG. 8). FIG. 8 shows optical images of the epoxy solution containing SWNTs at different loading percentages (from left to right: 0.002 vol %, 0.01 vol %, and 0.1 vol %). Both SWNTs and MWNTs were aligned in the bubble film, uniformly over centimeter length scales (FIGS. 3A and 3B). As an example, for a loading fraction of 0.05 vol %, the area density reached $3.6 \times 10^7$ cm$^{-2}$ for aligned SWNTs, and $1.6 \times 10^5$ cm$^{-2}$ for MWNTs. See FIG. 3B for MWNTs; the scale bar is 50 micrometers and the scale bar of the inset represents 20 micrometers. The area density of MWNTs was similar to SiNWs (both have comparable lengths of 30 micrometers to 50 micrometers), while SWNTs, with relatively short length of about 2 micrometers, reached much higher densities. For aligned SWNTs shown in FIG. 3A, the separation between adjacent tubes/bundles was about 1 micrometer to about 2 micrometers, and 90% of SWNTs had an angular deviation from their alignment orientation of less than about 5 degrees.

In FIG. 3A, the optical images (dark field) of aligned SWNTs over large areas embedded in bubble films are shown, with densities of greater than $3.6 \times 10^7$ cm$^{-2}$ (scale bar: 10 micrometers, inset: 5 micrometers).

Thus, the SWNT or MWNT films shown here are distinct from previously reported filtration films, buckypapers, or yarned sheets. Filtration usually produced multiple layers overlapped nanotubes, while the SWNT films had a single-layer of ordered nanotubes spread due to bubble expansion. MWNT sheets also contained entangled MWNTs due to the twisting and yarning process. For making device arrays, individual nanotubes (or bundles) with controlled separation and alignment may be useful. Buckypapers or MWNT sheets may have a relatively high conductivity due to overlap of nanotubes, while the SWNT or MWNT films can either insulate or be conductive, depending on the loading percentage in the bubble solution, as demonstrated below.

Figure 3C:
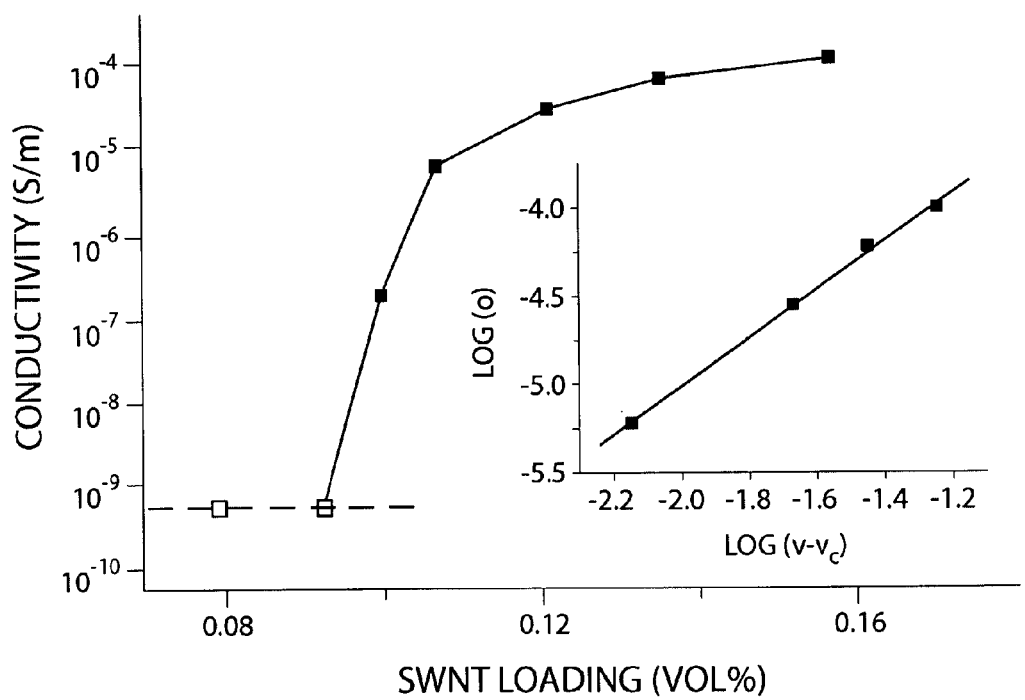

By increasing the nanotube (NT) loading percentage in the bubble solution, electrically conductive films were blown using the embedded nanotubes interconnected to form a conducting path. FIG. 3C shows that the percolation threshold of SWNT films was about 0.1 vol %, and the film conductivity rapidly increased over five orders of magnitude to nearly $10^{-4}$ S/m, at a loading of about 0.16 vol %. The inset in FIG. 3C is a logarithmical plot of conductivity versus volume fraction for this example. The linear fitting produced a critical component t=1.37.

For comparison, polymer-nanotube films prepared by solution casting or spin coating showed lower percolation thresholds (e.g. 0.03 vol % or 0.05 vol %), and theoretical simulations have predicted a loading of nanotubes on the order of 0.01 vol % to achieve percolation. The higher percolation threshold measured in this bubble film system (0.1 vol %) may be due to the alignment of the SWNTs, which can reduce the possibility of contacting neighboring nanotubes compared with a random distribution. Nonetheless, the conductivity of bubble films when above percolation ($10^{-4}$ S/m at 0.16 vol %) was one to two orders higher than that of the composite films prepared by spin coating ($10^{-5}$ S/m at 0.5 vol %) or solution casting ($10^{-6}$ S/m at 0.5 vol %), where the composite systems contained randomly dispersed nanotubes. Possible reasons for enhanced conductivity in the current bubble films is that aligned SWNTs (forming a slightly anisotropic system), once reaching the loading threshold, provide more percolated pathways than a completely isotropic system of random SWNT networks. Recent experiments and simulations have shown that the highest conductivity occurs when the aspect ratio shows a certain level of alignment. These conductive SWNT films have potential application as electromagnetic interference shielding materials and antistatic coatings.

Classical percolation theory describes a scaling law of composite conductivity ($\sigma$) (sigma) in terms of filler content as $\sigma \propto (v-v_c)t$, where $v$ is the volume fraction of fillers, $v_c$ is the threshold value, and t is the critical component. A logarithmical plot of conductivity versus SWNT loading and linear fitting generated t=1.37 (FIG. 3C, inset). While the value of the critical component is usually in the range of 1.33 to 2 for two-dimensional systems (t=1.33) and three-dimensional systems (t=2), these results (t=1.37), close to the lower limit; indicate the SWNT film may virtually be a two-dimensional system.

EXAMPLE 4

Figure 4A:
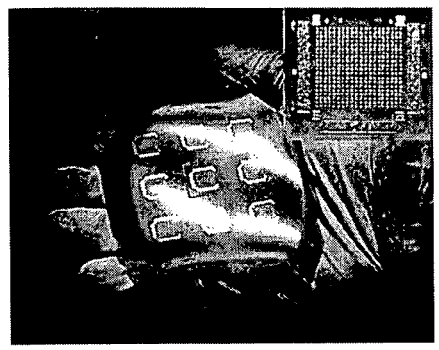
FIGS. 4A-4G illustrate the formation of an electric circuit comprising aligned nanowires, in yet another embodiment of the invention.

In this example, large arrays of SiNW FETs were fabricated on flexible plastics. As shown in FIG. 4A, plastic NWFET arrays were fabricated with blown aligned SiNWs on a Kapton substrate, a polyimide based plastic with excellent thermal and mechanical properties. Nine SiNW-FETs device arrays are shown. The plastic substrate shows flexibility and transparence. Regarding the inset (right), an optical image highlights one device array that is enclosed in the rectangle. A top gate device configuration was adopted using a thin high-k material $HfO_2$ (~20 nm thickness) deposited by the low temperature (110° C.) atomic layer deposition (ALD) process as the gate dielectric and Cr/Au (5/50 nm thickness) electrodes as the top gate. Each transistor had a parallel array of SiNWs (~12 NWs, channel width W=80 micrometers, channel length L=2 micrometers). FIG. 4D is a dark field optical image showing one typical top-gated SiNW-FET device (s/d 50 nm Ni contacts, about 20 nm $HfO_2$ gate dielectric, and a 5/50 nm Cr/Au top gate electrode).

Figure 4B:
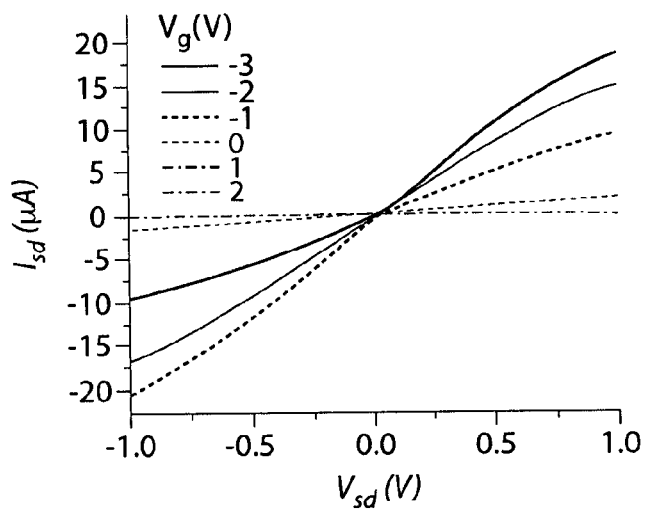
Figure 4C:
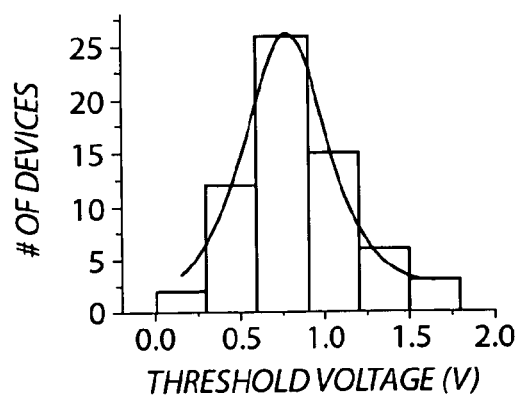
Figure 4D:
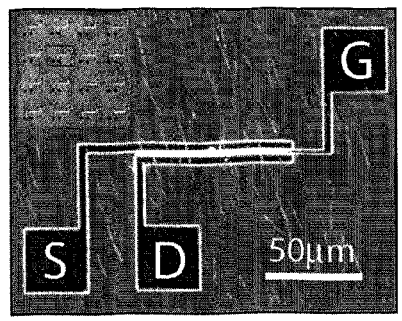
Figure 4E:
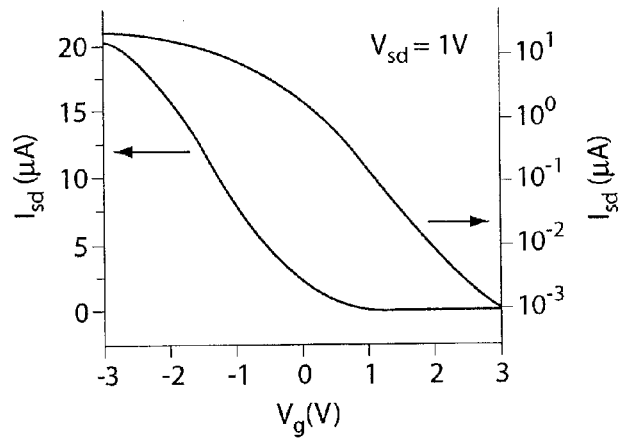

Typical source-drain current ($I_{sd}$) versus source-drain voltage ($V_{sd}$) data, recorded at various gate voltages ($V_g$), and $I_{sd}$ versus $V_g$ relations at $V_\mu$=1 V are shown in FIG. 4B. In this figure, the typical $I_{sd}$-$V_{sd}$ characteristics of a 12 multi-NW FET device at various $V_g$, starting from –3 V to 2 V in 1 V steps is shown. In FIG. 4E, the corresponding $I_{sd}$-$V_g$ relation at $V_{sd}$=1 V is plotted on a linear scale (left axis) and a log scale (right axis).

The family of $I_{sd}$-$V_{sd}$ curves exhibited a nearly linear response, indicating ohmic contact between the NWs and the source-drain electrodes. The $I_{sd}$-$V_g$ transfer curve recorded at $V_{sd}$=1 V gave a peak transconductance, $g_m$=$dI_{sd}/dV_g$, of about 7 micrometers. Taking the effective channel width as the total NW diameter multiplied by the number of NWs, the scaled value of $g_m$ reached about 30 μS/μm. This typical device showed an "on" current $I_{on}$~21 microamps at $V_{sd}$=1 V. Extrapolation of the linear region resulted in a low threshold voltage, $V_t$ of 0.6 V.

Figure 4F:
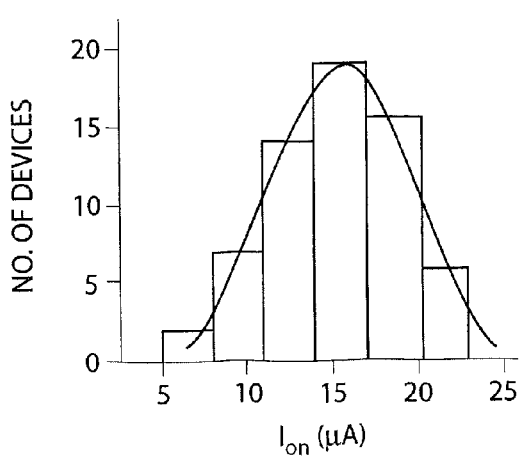

The logarithmic plot of $I_{sd}$-$V_g$ curve showed a device on/off ratio >$10^5$, and a subthreshold slope, S=–[d($log_{10}I_{sd}$)/$dV_g$]$^{-1}$, of about 600 mV per decade. Thus, this device performance of low $V_t$ and S, and a high $g_m$. $I_{on}$ and the on/off ratio is thus comparable to or better than the characteristics of the prior art, including amorphous silicon, polycrystalline silicon, and organic transistors on plastic substrates. In addition, measurements performed on over 60 SiNW-FET devices yielded average threshold voltage values of 0.83±0.32 V and on-current values of 15.1±3.7 A, and showed a narrow distribution of $V_t$ and $I_{on}$ (FIG. 4C). In FIG. 4C, a histogram of the threshold voltage ($V_t$) distribution from over 60 studied devices shows high uniformity and reproducibility of devices. Gaussian fitting (curve) shows a standard deviation of 0.32 V (0.83±0.32 V). In FIG. 4F, the device-to-device uniformity is also confirmed by the histogram of on current ($I_{on}$). Gaussian fitting (curve) shows a standard deviation of 3.7 microamps (15.1±3.7 microamps). This thus confirms the uniformity of device performance and reproducibility and general applicability of the assembly methodology shown in these examples.

EXAMPLE 5

This example describes additional details of the procedures used in Examples 1-4. The 20 nm silicon nanowires used in FIGS. 2 and 4 were synthesized as p-type nanowires by chemical vapor deposition of silane $SiH4$ and diborane $B_2H_6$ with Si:B ratio of 4000:1 using mono-dispersed gold nanocolloids (British Biocell International Ltd) as catalysts. Typically, growth was carried out for 30 min in a quartz tube reactor, with temperature at 440° C., total pressure at 30 torr and silane partial pressure at 3 torr.

The CdS nanowires were synthesized using a thermal evaporation method, in which CdS powder was used as solid state precursor and heated up to generate vapor source. In a typical growth, a small amount of CdS powder (~0.5 gram) was loaded into a ceramic combustion boat, which was inserted in the center of quartz tube furnace, and the growth substrate with 30 nm gold nanocolloids was placed at the downstream edge of heating coil. The reactor was heated to 600° C. with 30 sccm (standard cubic centimeters per minute) of hydrogen flow under 30 torr total pressure.

Nanowire and carbon nanotube functionalization. The nanowire substrates were modified in a 1% (v/v) tetrahydrofuran solution with 5,6-epoxyhexyltriethoxysilane (Gelest, Inc.) for 2 h, rinsed with tetrahydrofuran and cured at 110° C. for 10 min.

The SWNTs (purified arc-discharge SWNTs, Carbon Solutions, Inc.) were functionalized by n-octadecylamine (ODA) to obtain soluble SWNTs in tetrahydrofuran (THF), and a well-dispersed solution in epoxy was prepared using THF as a transfer solvent. Briefly, 300 mg SWNTs were mixed with 2 g ODA and heated in an oil bath at a set temperature of 120° C. for 4 days. The ODA-functionalized SWNTs were washed by ethanol (repeated sonication and filtration for 6 to 8 times) and dried naturally at room temperature overnight. TEM observation revealed that SWNTs were in the form of small bundles with lengths of about 2 micrometers, and the sample is clean (i.e., with few catalyst particles). The solubility of ODA-SWNTs in THF was greater than 5 mg/ml. The ODA grafted SWNTs formed a stable solution in THF (and then epoxy), and for a loading of 0.1 vol %. No obvious agglomeration was observed during the curing process (FIG. 8).

MWNTs, produced by CVD processes, using ferrocene and xylene as precursors at a reaction temperature of 800° C., were dispersed in 5 M nitric acid and heated at 110° C. to introduce carboxylic acid groups on MWNTs, followed by filtration and washing in distilled water. The MWNTs (500 mg) were then mixed with ODA powder (about 2 g) and heated in an oil bath at 120° C. for 3 to 4 days. The ODA functionalized MWNTs showed improved solubilities in THF (greater than 1 mg/ml), compared with the grown MWNTs (nearly zero).

Preparation of nanowire/nanotube solutions for bubble blowing. About 1 mg to 15 mg functionalized nanowires, or 5 mg to 20 mg ODA-SWNTs, were dissolved into 3 ml to 4 ml tetrahydrofuran (THF) to make different loading percentage solutions by ultrasonication. 5 g high temperature epoxy part A (HT 3:1 epoxy, Fiberglass Hawaii) was added into the THF solution and shaken for 5 minutes by a Thermolene Mixer (model M37615). Then, 1.7 g epoxy part B (hardener) was added into the solution and shaken for another 5 minutes. The resulting solution was capped tightly in a bottle and aged over time. A photograph of SWNT-epoxy solutions at different loading percentages was shown in FIG. 8B. During the first 10 hours the solution was shaken periodically for every 2 hours, and then allowed to sit at room temperature (about 25° C.). Generally it took 20 to 30 hours for the solution to achieve the desired viscosity range for blowing large, stable bubbles (in this example, about 15 Pa·s to 25 Pa·s, as measured using an AR-2 rheometer, TA Instrument).

Electrical conductivity measurement of SWNT films. SWNT films coated on Si/$SiO_2$ wafer (600 nm oxide) were cut into square pieces with a size of 6×6 $mm^2$. The films were firstly etched about 50 to 100 nm by RIE plasma. Electrode pairs in the shape of long strips were made by evaporating firstly 5 nm Cr and then 100 nm Au using a shadow mask. The two Au/Cr electrodes (width: w=5 mm) at a fixed distance (D=5 mm) enclose a sample area of w×D=5×5 mm², and standard two probe testing was performed on SWNT films with different loadings, during which time the I-V curve was recorded by a probe station (Agilent 4156 C, Precision Semiconductor Parameter Analyzer). DC resistance is $R_{DC}$=V/I. Sheet resistance ($R_\square$, i.e., R-square) was obtained by $R_\square = R_{DC}(W/D)$, and sheet resistivity by $\rho = R_\square t$, where t is the film thickness. The sheet conductivity is $\sigma = 1/\rho$.

To verify the validity of such 2-probe measurements, samples of the same SWNT loading, but with a scaled down distance between Cr/Au electrodes, were tested, and the resistances show linear relationship with the electrode distance. The contact resistance was estimated by the intercept of the y coordinate in the plot of resistance versus electrode distance to be 78 MΩ (megohms), which is negligible compared with the film resistance (on the order of $10^{11}$ Ω (ohms)).

Device fabrication and measurement. The bubbled thin film loaded with single-walled carbon nanotubes transferred onto SiO₂/Si substrate was first etched by RIE (Nexx Systems, Cirrus 150) with 20 sccm of O₂ flow under 50 mTorr pressure at 200 watt microwave power and 100 watt RF power for 30 s (etching rate of epoxy under this condition is 200 nm/min) to partially remove the top layer epoxy to ensure good contact between SWNT and Cr/Au (5/100 nm) strips, which were thermally evaporated on the edges of samples.

For top-gated silicon nanowire FET devices on plastics in FIG. 4, a piece of Kapton (polyimide based plastic), which was first spin cast with a thin layer of ~1 micrometer thick SU-8 (MicroChem Corp.) photoresist and cured, for better metal adhesion, was used as the substrate for silicon nanowires incorporating bubble film transfer, followed by RIE etching (the same recipe as above) and photolithography to define the source and drain electrodes. Prior to thermal evaporation of Ni (50 nm) contact, the native oxide of SiNWs was etched for 10 s by a commercially available buffered hydrofluoric acid solution (Transene, Inc.). A thin high-k dielectric film of ~20 nm HfO₂ was conformally deposited onto devices using the low temperature (110° C.) atomic layer deposition (ALD) process. The gate electrodes were defined by photolithography and were further metallized via thermal evaporation of Cr/Au (5/50 nm). The top gate metal slightly overlapped with source and drain contact.

The electrical measurements on the devices were carried out at room temperature using a Cascade Microtech probe station.

Confocal scanning microscope imaging aligned CdS NWs film. A confocal microscope system (LSM 510 Meta, Zeiss) was used to image the fluorescence of well aligned CdS NWs in the bubble film (FIG. 7). The conditions used for imaging were: excitation, Ar-ion laser line 458 nm, narrow bandpass; emission, 505-550 nm bandpass.

EXAMPLE 6

Blown film extrusion is a well-developed process for the manufacture of plastic films in large quantities, which involves extruding a molten polymer and inflating it to obtain a balloon, which can be collapsed and slit to form continuous flat films with widths exceeding 1 m at rates in the order of 500 kg h⁻¹. This example applies this basic idea to the formation of nanocomposite films where the density and orientation of nanowires and/or nanotubes are controlled within the film. This example (FIG. 1A) includes the preparation of a homogeneous, stable and controlled concentration polymer suspension of nanowires and/or nanotubes, expansion of the polymer suspension using a circular die to form a bubble at controlled pressure and expansion rate, where stable vertical expansion is achieved using an external vertical force, and the transfer of the bubble film to substrates or various open frame structures.

This example illustrates silicon nanowire ("NW") blown-bubble films ("BBFs"), as silicon nanowires can be produced in high yield with uniform diameters and electronic properties. For instance, FIG. 1A shows a blown bubble film (BBF) process, with (i) a nanowire and/or nanotube polymer suspension, (ii) bubble expansion over a circular die and (iii) films transferred to crystalline wafers, plastics, curved surfaces and open frames. In (ii), nitrogen gas at pressure P flows through the die and expands a bubble from the NW/NT-epoxy suspension (dark color) on the top of the die while a stable vertical force, F, is applied by means of a wire-ring connected to a controlled speed motor. Black straight lines represent aligned nanowires and/or nanotubes embedded in the bubble film.

Figure 14A:
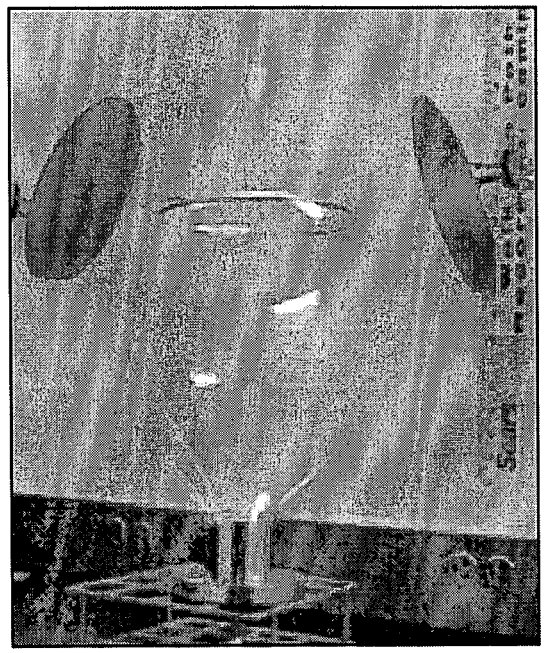
FIG. 14A-14B illustrate a method of producing a film of liquid, in yet another embodiment of the invention.
Figure 14B:
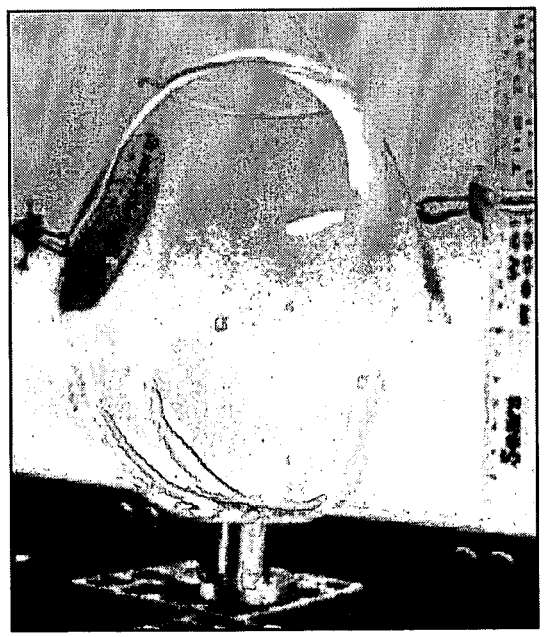

Initially, silicon nanowires were covalently modified using 5,6-epoxyhexyltriethoxysilane, and then combined with an epoxy solution to yield stable and well-dispersed suspensions from 0.01-0.22 wt % (see below). Once the silicon nanowire-epoxy suspension viscosity increased to 15-25 Pa s during polymerization, 0.5-1 g of the suspension was transferred uniformly onto the top surface of a die, and blown into a single bubble using a nitrogen flow (P=150-200 kPa) that directed the expansion vertically at a rate of 10-15 cm min⁻¹ (FIGS. 14A-14B). These figures are photographs of directed bubble expansion process at relatively early and final stages, respectively. The ring visible at the top of the bubble moves upwards at a constant speed during expansion. In FIG. 14B, the blown-bubble film (bubble diameter 35 cm; height 50 cm) has coated the surface of two 150-mm silicon wafers. The range of the ruler behind bubble is 0 to 23 inches. Stable vertical expansion was facilitated by an upward moving ring that kept the bubble centered over the die. Bubbles could be routinely produced with diameters greater than 25 cm and heights greater than 50 cm using this semi-automated process (see below). Larger dies and greater control of the expansion process may allow much larger diameter bubbles to be produced, analogous to the bubbles of 1 to 2 m diameter produced during automated processing of homogeneous polymers.

The blown-bubble films could be transferred to both rigid and flexible substrates during the expansion process. For example, two 150-mm silicon wafers were fixed in positions close to the central axis of the die/bubble (FIG. 14A), and the bubble expansion was then continued until it covered the entire wafer surfaces (FIG. 14B). Optical inspection of the silicon nanowire-blown-bubble film transferred to a 150-mm diameter wafer (FIG. 2A) showed that the transferred film was generally uniform over the entire substrate, and more generally, these studies showed that 80-90% of the transferred films were defect free, although small defects could be observed in some samples due to trapped gas during film transfer.

FIG. 2A is an image of a 0.10 wt % silicon nanowire blown-bubble film transferred to a 150-mm silicon wafer. The insets are dark-field optical images showing silicon nanowires in the film. The arrows point to the locations where the images were recorded. The orientation of the silicon nanowires corresponds to the upward expansion direction. The scale bar is 10 mm, and is the same in all insets. Higher magnification the dark-field optical images (insets in FIG. 2A), which resolved individual silicon nanowires within the transferred blown-bubble film, showed that the silicon nanowires recorded from different areas of this large substrate were well aligned along the upward expansion direction of the bubble.

Indeed, the angular deviation of the silicon nanowires was less than 10° over the entire 150 mm-diameter wafer and represented a very substantial advance over previous studies.

Orientational alignment of the silicon nanowires was observed for blown-bubble films with different nanowire densities prepared from 0.01-0.22 wt % silicon nanowire-epoxy suspensions (FIGS. 1B and 2B-2D). FIG. 1B is a photograph of 0.01, 0.03, and 0.15 wt % (left to right) epoxy suspensions of silicon nanowires. FIGS. 2B-2D are dark-field optical images recorded from 0.01 (FIG. 2B), 0.03 (FIG. 2C) and 0.15 (FIG. 2D) wt % silicon nanowire blown-bubble films, respectively. The scale bars in these figures are 50, 20 and 10 mm, respectively.

Qualitatively, the shear stress associated with the suspension passing through the circumferential edge of the die may align the high aspect ratio nanowires in a polymer fluid along the principal direction of strain. This explanation is consistent with previous observations of shear-induced alignment of rod-like micro/nanostructures in fluid systems. As the bubble expands primarily in the vertical direction, with a continuous supply of the nanowire suspension from the top surface of the die, the orientation of the nanowires in the blown-bubble film may follow the upward (longitude) direction, which is consistent with the optical images. Expansion along a defined direction, as achieved in this approach, may allow consistent alignment of the nanowires over large areas, and may allow the overall orientation to be fixed in an absolute sense during transfer to a substrate, independent of high-resolution imaging.

There is a decrease in silicon nanowire separation (center-to-center spacing) and an increase in density in the transferred blown-bubble films as the starting concentration increased from 0.01-0.22 wt % (FIG. 2F). FIG. 2F is a plot of the average silicon nanowire spacing and density as a function of the silicon nanowire loading. The points were obtained from analysis of 3-8 independently prepared blown-bubble films per wt % suspension.

It was found that the nanowire separation could be varied over at least an order of magnitude from 50±8 to 3.0±0.6 micrometers as the concentration increased from 0.01-0.22 wt %. Correspondingly, the nanowire density increased from $4.0\pm0.6\times10^4$ to $4.0\pm0.5\times10^6$ $cm^{-2}$ for these same samples. The separations/densities of silicon nanowires produced in this example were relatively modest and were not optimized, but even these values are useful in some applications, such as nanoelectronic transistor arrays for biological/chemical sensing and displays. A plot of spacing versus wt % (FIG. 2F) showed saturation approaching a micrometer separation at higher silicon nanowire concentrations. These experiments suggest that this may be in part attributed to observed nanowire aggregation, although one also expects similar behavior based on this physical process (that is, a two-dimensional layer of particles should have a (particle concentration)$^{-1/2}$ functional dependence). Hence, the surface chemistry can be further optimized to allow uniform higher wt % suspensions to be prepared. This allows for data extending the separation (density) versus wt % curves.

Figure 6A:
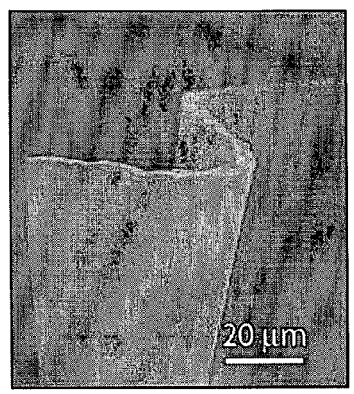
FIGS. 6A-6D illustrate the thickness of films of liquid produced according to other embodiments of the invention.
Figure 6B:
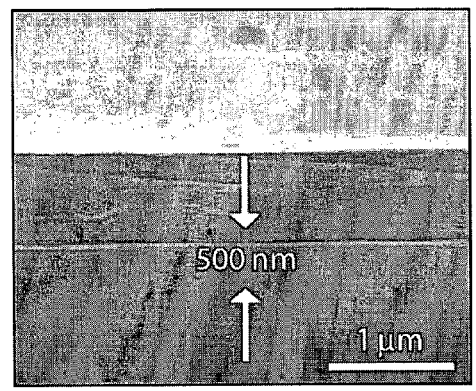

In addition, scanning electron microscopy (SEM) and transmission electron microscopy (TEM) images (see FIGS. 6A and 6B) showed that the blown-bubble films had a uniform thickness, typically 200-500 nm. FIG. 6A is an SEM image of a free-standing silicon nanowire blown-bubble film. The scale bar is 10 micrometers. FIG. 6B is an image of a 500 nm thick film transferred to a planar silicon substrate. The scale bar is 500 nm. This observed variation may be due to differences in suspension volume transferred to the die prior to expansion and the final size of the bubble, and can be readily reduced by further process optimization.

Figure 6C:
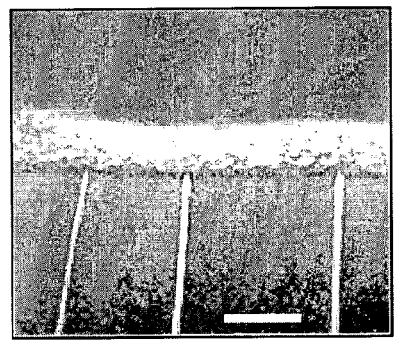
Figure 6D:
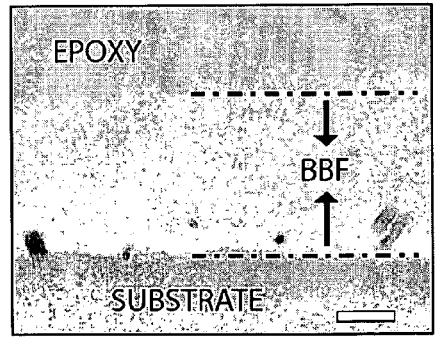

FIG. 6c is an SEM image of a silicon nanowire blown-bubble film on a silicon substrate following RIE etching to remove the epoxy matrix in the lower half of the image. The vertical white linear structures correspond to 3 silicon nanowires that are on outer surface of the blown-bubble film and are in contact with the substrate. The scale bar is 500 nm. FIG. 6D is a TEM cross sectional image of a silicon nanowire blown-bubble film showing silicon nanowires (dark spots) near the lower edge (outer surface) of the film. The scale bar is 100 nm. The silicon nanowire blown-bubble film were transferred to plastic cover slips (substrate), embedded in an epoxy resin (epoxy), sectioned roughly perpendicular to the silicon nanowire alignment direction with a diamond ultramicrotome. The SEM and TEM images of transferred films (see FIGS. 6C and 6D) also showed that most of the silicon nanowires were at the outer surface (of the bubble) and thus close to the substrate. The observed nanowire distribution may be attributed to a drift of the aligned nanowires in the polymer fluid to the outer surface due to the pressure gradient between the inner and outer walls. The drift velocity of nanowires (toward the outer surface and along the normal of bubble curvature) and the distance traveled during bubble expansion can be estimated using methods such as the Faxen Laws, and appear to be consistent with the observation of nanowires at the outer bubble surface.

The generality of the above approach was also explored in terms of nanowire and nanotube materials, substrate structures and size scaling. For example, stable and homogeneous suspensions of the direct band-gap CdS nanowires were made and then used to prepare CdS nanowire-blown-bubble films (see below). Optical images of transferred blown-bubble films demonstrate uniform, well-aligned and controlled-density CdS nanowires with strong green emission (see FIGS. 7A-7C). FIG. 7A is a fluorescence image of a 0.15 wt % CdS nanowire solution. The inset is a bright-field image of the solution. FIG. 7B is an optical image of a CdS nanowire blown-bubble film transferred to a 3×4.5 $cm^2$ 100 micrometer thick mylar substrate under UV excitation. The inset is a bright field image of the same substrate. FIG. 7C is a confocal microscopy image of a CdS nanowire blown-bubble film transferred to a silicon wafer; scale bar is 50 micrometers. The inset is a higher-resolution confocal microscopy image showing well-aligned individual CdS nanowires; scale bar is 10 micrometers. The confocal microscope (LSM 510 Meta, Zeiss) was used with 458 nm excitation and luminescence was collected over a 505-550 nm range. The ability to prepare aligned and controlled density arrays from different nanowires allows a number of opportunities for basic research and applications, given the distinct chemical and functional properties available from nanowire building blocks.

In addition, single-walled NTs (SWNTs) and multi-walled NTs (MWNTs) were modified with n-octadecylamine and the resulting suspensions were used to prepare blown-bubble films (see below). FIG. 3A is a dark-field optical image of a SWNT-BBF prepared from 0.07 wt % solution; the film was transferred to a silicon wafer for imaging. The scale bar represents 10 mm. The inset is a high-resolution dark-field image highlighting the alignment of individual SWNTs; the scale bar is 2 mm. FIG. 3B is a dark-field optical image of an MWNT-BBF prepared from 0.15 wt % solution; the scale bar represents 25 mm. The inset is a high-resolution image showing aligned, individual MWNTs; the scale bar is 5 mm.

The transferred SWNT- and MWNT-blown-bubble films (FIGS. 3A and 3B) showed good alignment and uniformity over the 75-mm-diameter substrates used in the experiments, and could be transferred to much larger ones. For instance, the SWNTs exhibited an average separation of 1.5±0.4 micrometers, and 90% were aligned to within 5° of the average orientation. The good alignment of the SWNTs within the blown-bubble films is notable in that their lengths, about 1-2 micrometers, are approximately ten times shorter than the MWNTs about 20-25 micrometers) and the silicon nanowire (about 10-15 micrometers) materials used in these studies.

It was also found that longer MWNTs, which were somewhat curled initially, appeared straightened in the blown-bubble films. The high degree of alignment for nanostructures with a high aspect ratio can be understood within the framework of microhydrodynamics, in which the Peclet number, Pe, is estimated to be in the range of $10^3$ to $10^6$ (>>1) for the lengths of nanostructures studied here. Sequential etching and SEM imaging also showed that the nanotubes are, like the nanowires, located at the outer ~60 nm of the blown-bubble films, close to a two-dimensional layer, contrasting with nanotube composites made by solution casting or spin coating, which usually contain randomly oriented nanotubes through the thickness of the films.

EXAMPLE 7

Figure 9B:
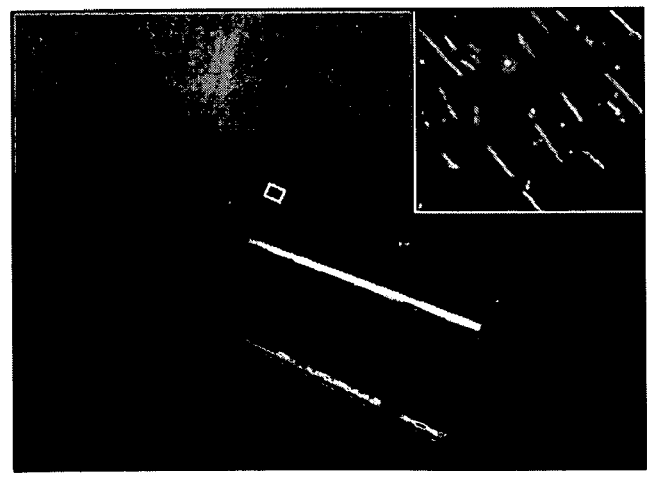

The blown-bubble film approach was also used to transfer aligned nanowire and nanotube films to a broad range of substrates. For example, a silicon nanowire blown-bubble film was transferred to a half cylinder (FIG. 9B). FIG. 9B is an image of a 0.10 wt % silicon nanowire blown-bubble film transferred to a curved surface (a half cylinder with diameter 2.5 cm and length 6 cm). The inset is a dark-field optical image showing silicon nanowires in the film. The rectangle in the main panel highlights the examined location and the scale bar is 10 mm.

Figure 15A:
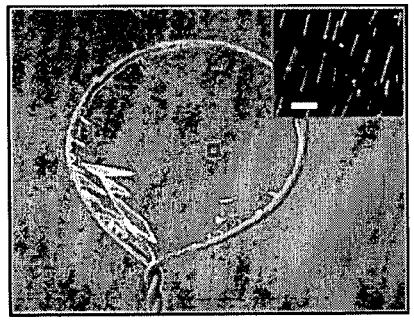
FIGS. 15A-15C illustrate a substrate containing nanowires, in one embodiment of the invention.

Subsequent darkfield optical images confirmed that the nanowires within the film were well aligned. It was also noted that nanowire and nanotube blown bubble films to could be transferred to flexible plastic substrates that were subsequently bent into curved structures. In addition to planar and curved substrates, nanowire and nanotube blown-bubble films have been transferred to open frames with good orientational alignment of the nanowire and nanotube materials (FIG. 15A), thus demonstrating the great flexibility of this approach. FIG. 15A is an image of a 0.10 wt % silicon nanowire blown-bubble film transferred to an open frame with a diameter of about 6 cm. The inset is a dark-field optical image showing silicon nanowires in the film. The rectangle highlights the examined location and the scale bar is 10 mm.

Importantly, this approach can be scaled to structures of very large area. A representative image of an SWNT-BBF transferred to a 200-mm wafer (FIG. 15B) shows that the film was remarkably uniform given the unsophisticated transfer process. Moreover, dark-field optical images (insets, FIG. 15B) demonstrated that the SWNTs had the same orientation and uniform separation across the diameter of this large substrate.

Figure 15B:
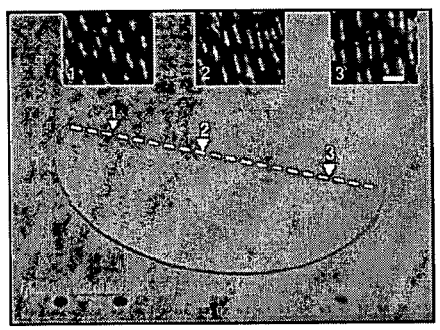
Figure 15C:
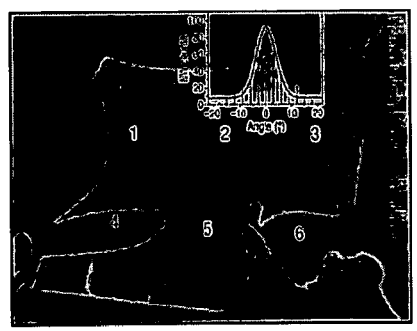
Figure 16A:
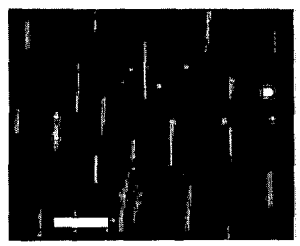
FIGS. 16A-16F illustrate nanowires contained within a plastic sheet substrate, according to another embodiment of the invention.
Figure 16B:
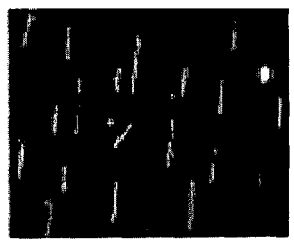
Figure 16C:
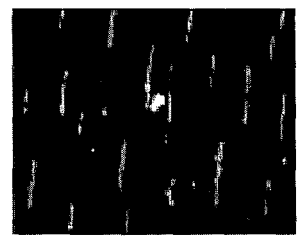
Figure 16D:
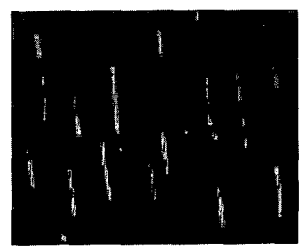
Figure 16E:
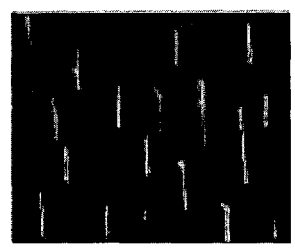
Figure 16F:
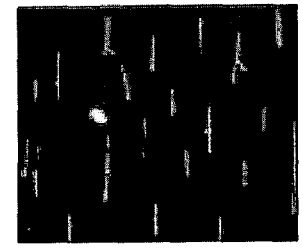

In particular, FIG. 15B is an image of a 0.07 wt % SWNT-BBF transferred to a 200-mm silicon wafer and its line-scanning alignment analysis. The insets are high-resolution dark-field images highlighting the alignment of SWNTs in the marked locations (triangles indicate recorded locations). The scale bar represents 2 mm, and is the same for all three insets. FIG. 15C is an image of a 0.10 wt % silicon nanowire blown-bubble film transferred to a 225 mm×300 mm plastic substrate. The inset is a histogram of angular distribution of >400 nanowires from the regions marked with numbers 1-6. More than 85% of the nanowires were aligned within ±6° of the upward expansion direction.

Silicon nanowire blown-bubble films were also transferred uniformly, with good control of the silicon nanowire alignment and density, to a large rectangular 225 mm×300 mm plastic sheet substrate (FIG. 15C; see also FIG. 16). A histogram of angle distribution of over 400 silicon nanowires taken from different locations over the entire plastic substrate showed that more than about 85% of the NWs were aligned within ±6° of the primary expansion/alignment direction. The numbers in each of FIGS. 16A-16F correspond to the locations in FIG. 15C where the optical micrographs were recorded. These dark field images showed relatively uniform alignment of the silicon nanowires in the film. The scale bar is 10 micrometers, and the same for all six images.

EXAMPLE 8

Figure 4G:
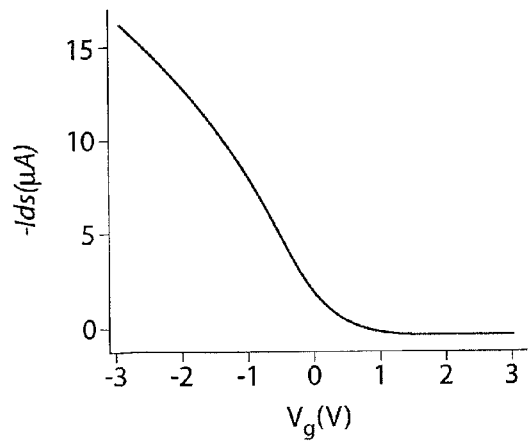

The high degree of alignment, controlled density and large area coverage possible with nanowire and nanotube blown-bubble films allows a number of integrated electronics applications of these nanomaterials. To illustrate this potential, in this example, arrays of independently addressable nanowire field effect transistors (FETs) were fabricated from silicon nanowire blown bubble films transferred directly to 75-mm-diameter plastic substrates (see below). FIGS. 4A-4B show a 3×3 repeating transistor array, where each of the nine elements of the overall array had 400 independently addressable multi-nanowire transistors in a 20×20 array (inset, FIG. 4A). This photograph shows a plastic substrate containing nine silicon nanowire-FET device arrays. The device arrays were prepared by standard processing, following transfer of the silicon nanowire blown-bubble film to the plastic. The inset is an optical image of one device array from the center of the substrate. The FETs (FIG. 4B) contained, on average, 12 silicon nanowires per device, although this number can be varied through changes in the wt % solution used for the blown-bubble film and/or the sizes of the contact electrodes, etc. FIG. 4B is a dark-field optical image of one typical top-gated silicon nanowire-FET device; the scale bar represents 50 mm. The inset is an optical image of a 4×4 silicon nanowire FET subarray. The rectangle highlights a single device. FIG. 4G is a plot of a typical $I_{ds}$-$V_g$ characteristic of a 12-silicon nanowire-FET device recorded with $V_{ds}$=−1 V.

Representative drain-source current, $I_{ds}$, versus gate voltage, $V_g$, data (FIGS. 4F-4G and 17) yielded a peak transconductance, $g_m$=$dI_d/dV_g$, of 6 microsiemens with an on current, $I_{on}$, of about 16 microamps, an on/off ratio >$10^5$ and a threshold voltage, $V_t$, of 0.55 V. These values compare well with, or exceed, previous multi-silicon nanowire FETs prepared using Langmuir-Blodgett assembly, and moreover, significant improvements are possible, for example, by using higher performance Ge/Si core/shell nanowires. Importantly, histograms of $V_1$ and $I_{on}$ (FIGS. 4C and 4F), showed that these properties, critical to integrated systems, were well constrained, with values of 0.81±0.32 V and 15.1±3.7 mA, respectively. In particular, FIG. 4C is a histogram of the threshold voltage determined from the analysis of more than 60 randomly chosen devices in the larger array; the curve is a Gaussian fit. FIG. 4F is a histogram of $I_{on}$ showing uniform device characteristics, where the curve is a Gaussian fit.

Figure 17A:
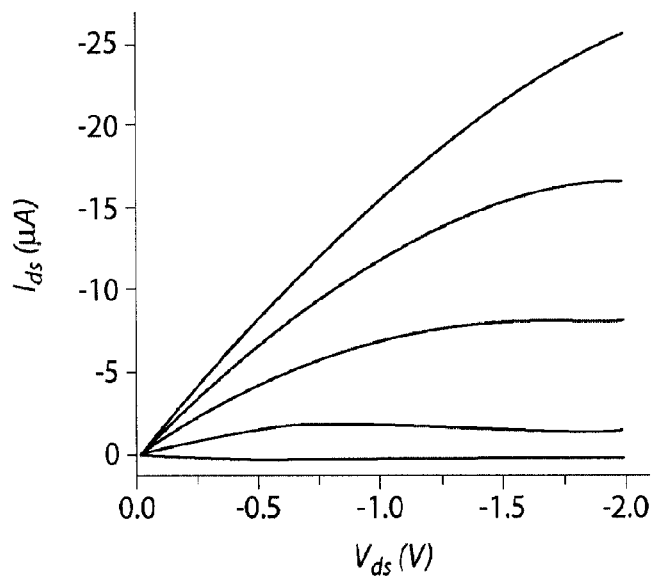
FIGS. 17A-17B illustrate current vs. voltage characteristics of certain devices produced according to one embodiment of the invention.
Figure 17B:
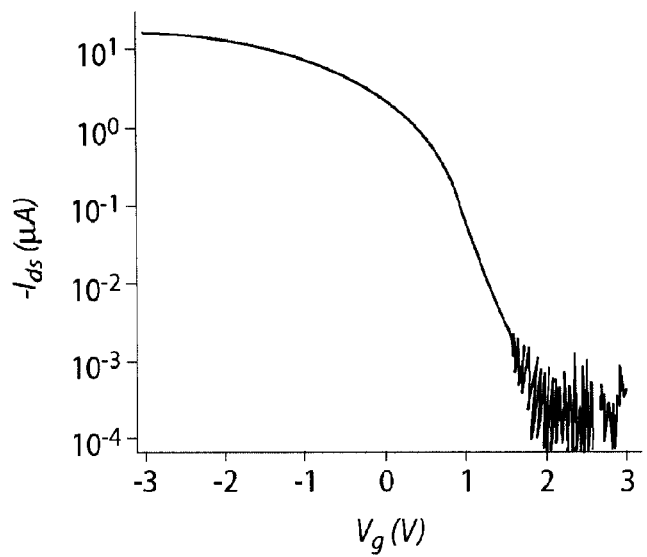

FIG. 17A are typical $I_{ds}$-$V_{ds}$ characteristics of a 12 silicon nanowire FET device vs. $V_g$; −3 to 3 V top to bottom in 1 V steps, where curves for $V_g$=1, 2, and 3 V overlap on this current scale. FIG. 17B is a log scale plot of $I_{ds}$-$V_g$ recorded with $V_{ds}$=−1 V. These data are taken from the same device shown in FIG. 4G.

The good reproducibility of the silicon nanowire can be attributed to the uniform density, good alignment and preferential distribution of the nanowires at a single surface of the blown-bubble films (see FIG. 6), as this allows for the fabrication of repeatable device structures. The straightforward transfer of aligned silicon nanowire blown-bubble films to large substrates makes this process considerably more efficient than other fluid-directed or Langmuir-Blodgett assembly methods.

EXAMPLE 9

This example describes several techniques for use with some of the above examples.

Nanowire and nanotube functionalization. The 20-nm-diameter p-type Si NWs were synthesized by chemical vapor deposition of silane and diborane with a Si:B ratio of 4,000:1 using gold nanoparticles (Ted Pella) as catalysts. CdS NWs were prepared by thermal evaporation of CdS powder (Sigma-Aldrich) at the center of a quartz reaction tube with subsequent nanowire growth on a substrate containing dispersed 30-nm gold nanoparticles located at the downstream edge of a furnace heated to 600° C. in 30 s.c.c.m. of $H_2$ at a total pressure of 30 torr. Silicon and CdS nanowire growth substrates were modified with 1% (v/v) 5,6-epoxyhexyltriethoxysilane (Gelest) in tetrahydrofuran (THF) for 2 h, rinsed with THF and cured at 110° C. for 10 min. The functionalized nanowires were removed from growth substrates by sonication (60 W, 10 s). The mass of nanowires used in suspension was determined from the difference in weight of the substrate before and after sonication.

SWNTs (P3-SWNT, purified SWNTs with high carboxylic acid content, Carbon Solutions) and MWNTs (produced by chemical vapor deposition, as described previously) were modified with n-octadecylamine (ODA, Sigma-Aldrich). Briefly, 300 mg SWNTs were mixed with 2 g ODA and heated at 120° C. for four days. The ODA-functionalized SWNTs were washed with ethanol and dried in air. SEM images showed small bundles of ODA-SWNTs with lengths of approximately 2 micrometers. MWNTs (40 nm average diameter) were dispersed in 5 M nitric acid, heated at 110° C. to introduce carboxylic acid groups, and then isolated by filtration and washed with distilled water. Then 500 mg MWNTs were mixed with ODA (~2 g) and heated at 120° C. for 3 to 4 days. The ODA-functionalized MWNTs were washed with ethanol and dried in air.

Preparation of nanowire and nanotube suspensions. Functionalized nanowires (1-15 mg) or 5-20 mg ODA-SWNTs were suspended in 3-4 ml THF to obtain different wt % solutions. Then 5 g epoxy part A (FHI 3:1 HT Resin, Fiberglass Hawaii) was added to the THF solution, mechanically mixed (M37615 Mixer, Barnstead International) for 5 min, and 1.7 g epoxy part B (hardener) was added and the solution mixed for an additional 5 min. The resulting suspension was capped to prevent THF evaporation, and allowed to cure until the viscosity reached 15-25 Pa·s (AR-2 rheometer, TA Instruments). During the first 10 h, suspensions were shaken every 2 h, and allowed to sit thereafter. Typically, 20-30 h were required before the suspensions reached the desired viscosity range.

Semi-automated process for producing bubbles. Controlled bubble expansion was carried out using an apparatus having a 50-mm-diameter stainless steel die with a gas inlet (6.35 mm) at the bottom, an outlet (6.35 mm) at the top and a ring centered over the gas outlet, which was moved upward at a controlled speed. Rigid wafers and/or flexible substrates were set at fixed distances around the expansion axis. Nanowire and/or nanotube suspensions (0.5-1 g) were transferred to the polished top surface of the die, forming a membrane covering the gas outlet, and then $N_2$ gas (P=150-200 kPa) was introduced to initiate bubble expansion. The ring caught the top portion of the bubble and directed stable vertical expansion at an average speed of about 10-15 cm min$^{-1}$. Bubble films were transferred to wafer substrates during the expansion process.

Nanowire-FET arrays. Silicon nanowire blown-bubble films were transferred to 3-inch-diameter Kapton wafers (Kapton FPC polyimide film, DuPont) that were first coated with a ~1-micrometer-thick layer of cured photoresist (SU-8, MicroChem). Following oxygen reactive ion etching (Cirrus 150, Nexx Systems) to remove excess epoxy matrix, photolithography and metal deposition (50-nm Ni) were used to define source and drain electrodes. A ~20-nm $HfO_2$ dielectric was deposited over the wafer by low-temperature (110° C.) atomic layer deposition, and then gate electrodes were defined in a second photolithography and metal deposition (5-nm Cr; 50-nm Au) step. The devices were characterized at room temperature with a probe station (Summit 12561, Cascade Microtech) and semiconductor parameter analyzer (4156 C, Agilent Technologies).

Estimation of drift velocity of NWs during bubble expansion. The drift velocity ($U_{NW}-U_{fluid}$) of nanowires in a polymer fluid were calculated as $U_{NW}-U_{fluid}=c^2\nabla^2 U_{fluid}/6=(c^2/6\mu)(\partial p/\partial r)$, where U is the velocity along the normal direction (subscripts denote nanowires or fluid), c is the nanowire radius (10 nm), μ is the solution viscosity (25 Pa·s) and $\partial p/\partial r$ is the pressure gradient along the normal to the interface. Assuming a uniform pressure gradient, $\Delta p/\Delta r$ can be evaluated, where $\Delta p=150-100=50$ kPa is the pressure difference at the inner wall and outer surface of bubble and $\Delta r=200-500$ nm and 2-5 micrometers in the fully expanded regions and near to the die, respectively. The Faxen laws predict an increasing drift velocity ($U_{NW}-U_{fluid}$), about 10 to 100 nm/s from the beginning to the final stage of the expansion. During the expansion, the nanowires can move a distance of hundreds of nanometers, which is comparable to the expanded blown-bubble film thickness. Hence, this estimate is consistent with the observation that all of the nanowires were located at the outer surface film surface.

Calculation of the Peclet number for NW/NT polymer system. The Peclet number (Pe) can be calculated based on the lengths (L) of NWs/NTs using $Pe=L^3\mu\gamma/kT$ where μ (mu) is solution viscosity, γ (gamma) is the shear strain rate, and kT is the thermal energy. Given the variation of parameters, e.g., nanotube and nanowire lengths from 2 to 20 μm, solution viscosity from 15 to 25 Pa·s, shear strain rate during bubble expansion of about 5/s, and temperature of 300 K, the value of Pe was calculated to be about $10^3$ to about $10^6$, much larger than 1. The calculation results thus support the observed alignment of the nanotubes and/or nanowires.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method, comprising:
   providing a film of liquid, suspended in a gas, containing nanoscale wires; and
   depositing substantially parallel nanoscale wires on a surface by contacting at least a portion of the film of liquid containing the nanoscale wires to the surface.

2. The method of claim 1, wherein the gas is air.

3. The method of claim 1, wherein the gas does not contain oxygen.

4. The method of claim 1, wherein at least about 95% of the substantially parallel nanoscale wires on the surface have an average deviation of no more than about 20° from the average direction of the axes of each of the aligned nanoscale wires.

5. The method of claim 4, wherein the average deviation is no more than about 10°.

6. The method of claim 1, wherein the wires are suspended in the liquid.

7. The method of claim 1, wherein the liquid comprises an organic solvent.

8. The method of claim 1, wherein the liquid comprises tetrahydrofuran.

9. The method of claim 1, wherein the liquid comprises an epoxy.

10. The method of claim 1, wherein the liquid comprises a polymer.

11. The method of claim 1, wherein the liquid comprises poly(methyl methacrylate).

12. The method of claim 1, wherein the liquid comprises poly(ethylene).

13. The method of claim 1, wherein the liquid has a viscosity between about 15 Pa s and about 25 Pa s, as measured using a rotational rheometer.

14. The method of claim 1, wherein the film of liquid has physical characteristics such that it is able to be blown, under ambient conditions, to produce a bubble in the gas having a diameter of at least about 10 cm.

15. The method of claim 14, wherein the bubble has a diameter of at least about 15 cm.

16. The method of claim 15, wherein the bubble has a diameter of at least about 20 cm.

17. The method of claim 16, wherein the bubble has a diameter of at least about 25 cm.

18. The method of claim 1, wherein the surface is planar.

19. The method of claim 1, further comprising forming an electric circuit comprising at least some of the nanoscale wires.

20. A method for forming an electric circuit, comprising:
providing a film of liquid, suspended in a gas, containing nanostructures;
contacting the film of liquid to a surface to transfer at least some of the nanostructures, in a substantially parallel orientation, to the surface; and
forming an electric circuit comprising at least some of the nanostructures on the surface.

21. The method of claim 20, wherein the gas is air.

22. The method of claim 20, wherein the gas does not contain oxygen.

23. The method of claim 20, wherein the nanostructures comprise nanoscale wires.

24. The method of claim 20, wherein at least about 95% of the nanoscale wires on the surface have an average deviation of no more than about 20 from the average direction of the axes of each of the nanoscale wires.

25. The method of claim 24, wherein the average deviation is no more than about 10°.

26. The method of claim 20, wherein the nanostructures are suspended in the liquid.

27. The method of claim 20, wherein the liquid comprises an organic solvent.

28. The method of claim 20, wherein the liquid comprises tetrahydrofuran.

29. The method of claim 20, wherein the liquid comprises an epoxy.

30. The method of claim 20, wherein the liquid has a viscosity between about 15 Pa s and about 25 Pa s, as measured using a rotational rheometer.

31. The method of claim 20, wherein the film of liquid has physical characteristics such that it is able to be blown, under ambient conditions, to produce a bubble in the gas having a diameter of at least about 10 cm.

32. The method of claim 31, wherein the bubble has a diameter of at least about 15 cm.

33. The method of claim 32, wherein the bubble has a diameter of at least about 20 cm.

34. The method of claim 33, wherein the bubble has a diameter of at least about 25 cm.

35. The method of claim 20, wherein the surface is planar.

* * * * *